(12) United States Patent
Yim et al.

(10) Patent No.: US 12,598,976 B2
(45) Date of Patent: Apr. 7, 2026

(54) SEMICONDUCTOR DEVICE

(71) Applicant: Samsung Electronics Co., Ltd.,
Suwon-si (KR)

(72) Inventors: Jeong Hyuk Yim, Suwon-si (KR);
Wan Don Kim, Suwon-si (KR); **Hyun
Bae Lee, Suwon-si (KR); Hyo Seok
Choi, Suwon-si (KR); Geun Woo Kim**,
Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 299 days.

(21) Appl. No.: 18/471,730

(22) Filed: Sep. 21, 2023

(65) Prior Publication Data

US 2024/0120279 A1 Apr. 11, 2024

(30) Foreign Application Priority Data

Oct. 11, 2022 (KR) ........................ 10-2022-0129841
Mar. 21, 2023 (KR) ........................ 10-2023-0036346

(51) Int. Cl.
| | |
|---|---|
| *H01L 23/00* | (2006.01) |
| *H01L 21/768* | (2006.01) |
| *H01L 23/528* | (2006.01) |
| *H01L 23/535* | (2006.01) |
| *H10D 30/43* | (2025.01) |
| (Continued) | |

(52) U.S. Cl.
CPC ...... *H01L 23/535* (2013.01); *H01L 21/76831*
(2013.01); *H01L 21/76843* (2013.01); ***H01L
21/76895* (2013.01); *H01L 23/5286*** (2013.01);
*H10D 30/43* (2025.01);
(Continued)

(58) Field of Classification Search
CPC . H01L 23/481; H01L 23/535; H01L 23/5283;
H10D 30/6735; H10D 62/121
See application file for complete search history.

(56) References Cited

U.S. PATENT DOCUMENTS

| | | |
|---|---|---|
| 9,779,992 B2 | 10/2017 | Kitao et al. |
| 10,636,739 B2 | 4/2020 | Beyne et al. |
| | (Continued) | |

FOREIGN PATENT DOCUMENTS

| | | |
|---|---|---|
| KR | 101697573 B1 | 1/2017 |
| KR | 101870155 B1 | 6/2018 |
| | (Continued) | |

OTHER PUBLICATIONS

European Search Report dated Mar. 20, 2024 for corresponding
European Patent Application No. 23201888.7.

*Primary Examiner* — Reema Patel
(74) *Attorney, Agent, or Firm* — HARNESS, DICKEY &
PIERCE, P.L.C.

(57) ABSTRACT

A semiconductor device may include a first film and a
second film defining parts of a trench, a plug conductive
film, a via, and a wiring in the trench. The trench may
include a second sub-trench having a second width below a
first sub-trench having a first width. The plug conductive
film may extend from a first side of the first film to penetrate
a bottom face of the trench. An uppermost face of the plug
conducive film may be in the trench. The via may include an
insulating liner between the plug conductive film and the
first film. The uppermost face of the plug conductive film
and at least a part of a side wall of the plug conductive film
may be in contact with the wiring. An upper face of the
insulating liner may be exposed by a bottom face of the
second sub-trench.

20 Claims, 30 Drawing Sheets

(51) Int. Cl.
    _H10D 30/67_          (2025.01)
    _H10D 62/10_          (2025.01)

(52) U.S. Cl.
    CPC ..... _H10D 30/6729_ (2025.01); _H10D 30/6735_
                    (2025.01); _H10D 62/121_ (2025.01)

(56)                    References Cited

U.S. PATENT DOCUMENTS

| | | |
|---|---|---|
| 11,004,789 B2 | 5/2021 | Doornbos et al. |
| 2013/0119543 A1 | 5/2013 | Yu et al. |
| 2021/0028112 A1 | 1/2021 | Kim et al. |
| 2021/0375722 A1 | 12/2021 | Kim et al. |

FOREIGN PATENT DOCUMENTS

| | | |
|---|---|---|
| KR | 2020/0133630 A | 11/2020 |
| KR | 2021/0012084 A | 2/2021 |
| KR | 102279729 B1 | 7/2021 |

SEMICONDUCTOR DEVICE

CROSS-REFERENCE TO RELATED APPLICATION

This application claims priority from Korean Patent Application No. 10-2022-0129841 filed on Oct. 11, 2022, and No. 10-2023-0036346 field on Mar. 21, 2023, in the Korean Intellectual Property Office and all the benefits accruing therefrom under 35 U.S.C. 119, the contents of each of which in its entirety are herein incorporated by reference.

BACKGROUND

1. Technical Field

The present disclosure relates to a semiconductor device.

2. Description of the Related Art

In recent years, with the rapid progress of down-scaling of semiconductor elements due to the development of electronic technique, there is a demand for higher integration and lower power consumption of semiconductor chips. An interval between circuit components such as wirings is gradually decreasing, which may increase resistance between the wiring and the via. Research for limiting an increase of resistance between the wiring and the via is being conducted to improve the reliability of the semiconductor device.

SUMMARY

Aspects of the present disclosure provide a semiconductor device in which a plug conductive film included in the via is brought into direct contact with the wiring to reduce the resistance between the via and the wiring.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an example embodiment of the present disclosure, a semiconductor device may include a first film including a first side and a second side opposite to each other; a second film including a third side and a fourth side opposite each other, the third side of the second film being in contact with the second side of the first film, the second film and the first film defining parts of a trench, the trench including a first sub-trench and a second sub-trench below the first sub-trench, the first sub-trench having a first width and extending from the fourth side of the second film toward the first film, the second sub-trench below the first sub-trench having a second width, the second width being smaller than the first width; a plug conductive film extending from the first side of the first film to penetrate a bottom face of the trench, an uppermost face of the plug conducive film being inside the trench; a via including an insulating liner between the plug conductive film and the first film; and a wiring in the trench. The uppermost face of the plug conductive film and at least a part of a side wall of the plug conductive film in the trench may be in contact with the wiring, and an upper face of the insulating liner may be exposed by a bottom face of the second sub-trench.

According to an example embodiment of the present disclosure, a semiconductor device may include a first film including a first side and a second side opposite each other; a second film including a third side and a fourth side opposite each other, the third side of the second film being in contact with the second side of the first film; a wiring including a first portion and a second portion, the first portion having a first width and extending from the fourth side of the second film toward the first film, the second portion below the first portion and having a second width, and the second width being smaller than the first width; and a plug conductive film extending from the first side of the first film to penetrate a bottom face of the wiring, an uppermost face of the plug conductive film and a part of side walls of the plug conductive film being in contact with the wiring; and a via including an insulating liner between the plug conductive film and the first film.

According to an example embodiment of the present disclosure, a semiconductor device may include a substrate including a first side and a second side opposite each other; an active pattern on the first side of the substrate; a source/drain region in contact with the active pattern; a frontside wiring structure on the first side of the substrate, the frontside wiring structure extending in a first direction and being electrically connected to the source/drain region; a through contact via electrically connected to the source/drain region, the through contact via because spaced apart from a side of the source/drain region; a buried wiring in the substrate and electrically connected to the through contact via; and a backside wiring structure electrically connected to the buried wiring, the backside wiring structure on the second side of the substrate. The buried wiring may include a first portion and a second portion below the first portion. The first portion may extend from the second side of the substrate toward the first side, and the first portion may have a first width. The second portion may have a second width. The second width may be smaller than the first width. The through contact via may include a plug conductive film and an insulating liner. The plug conductive film may penetrate through an upper face of the second portion. A lowermost face of the plug conductive film and a part of a side wall of the plug conductive film may be in contact with the buried wiring. The insulating liner may extend along the side wall of the plug conductive film.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
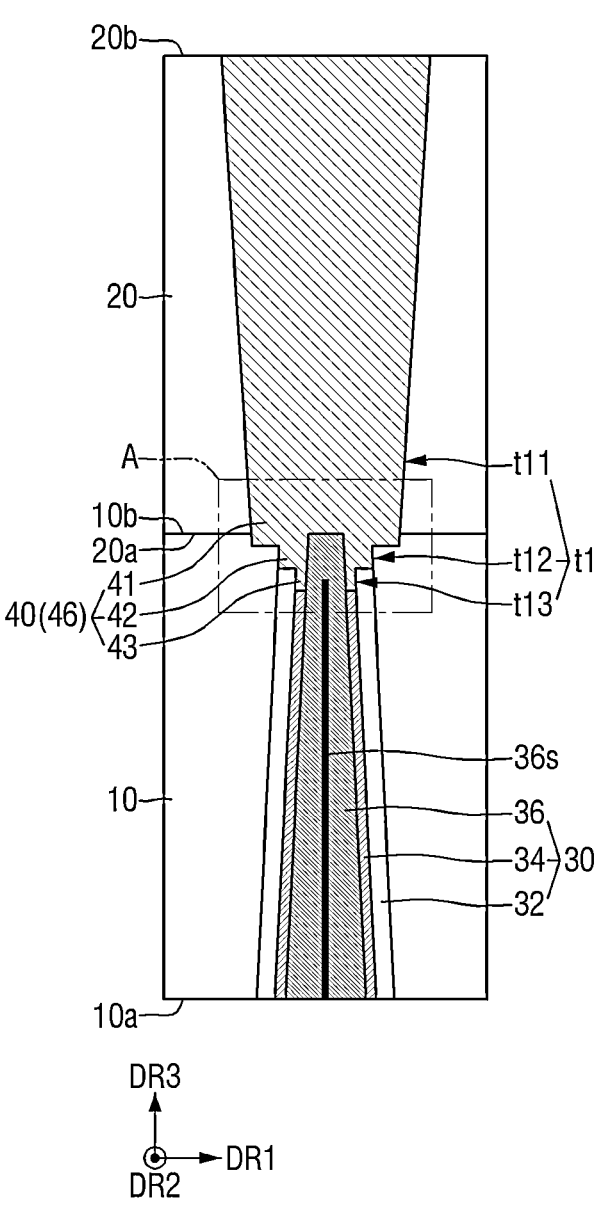
FIG. 1 is a diagram for explaining a semiconductor device according to some example embodiments.
Figure 2:
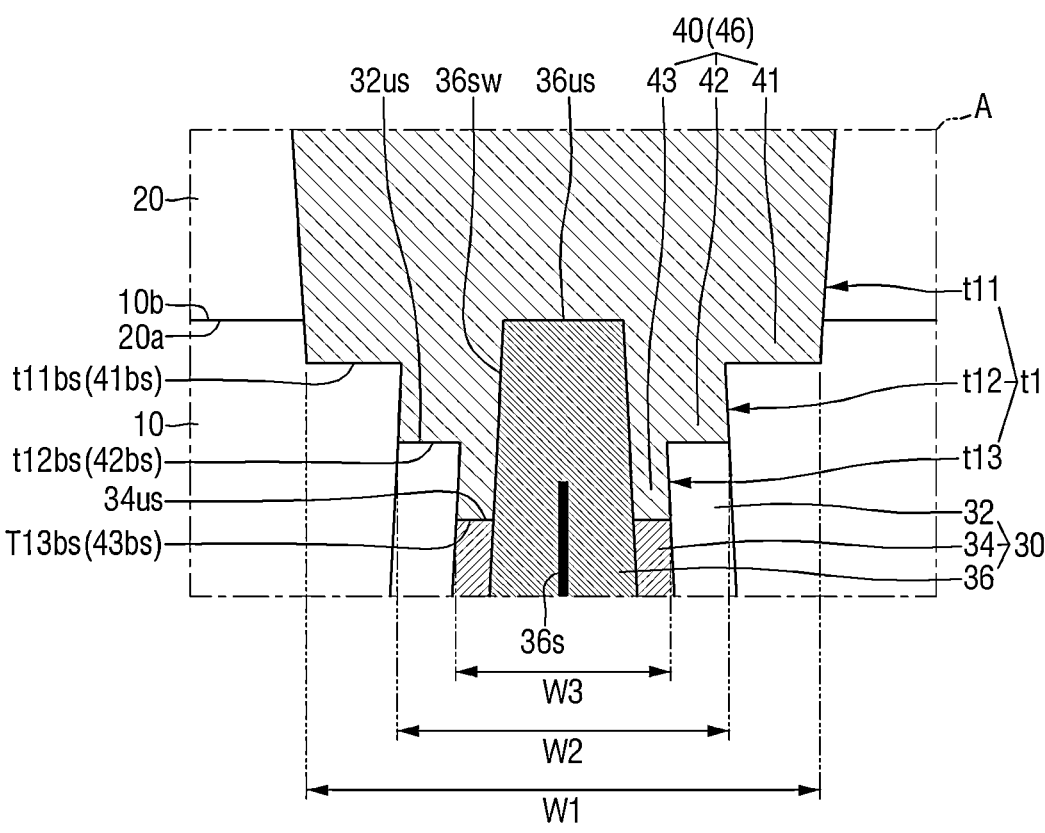
FIGS. 2 and 3 are enlarged views of a portion A of FIG. 1.
Figure 3:
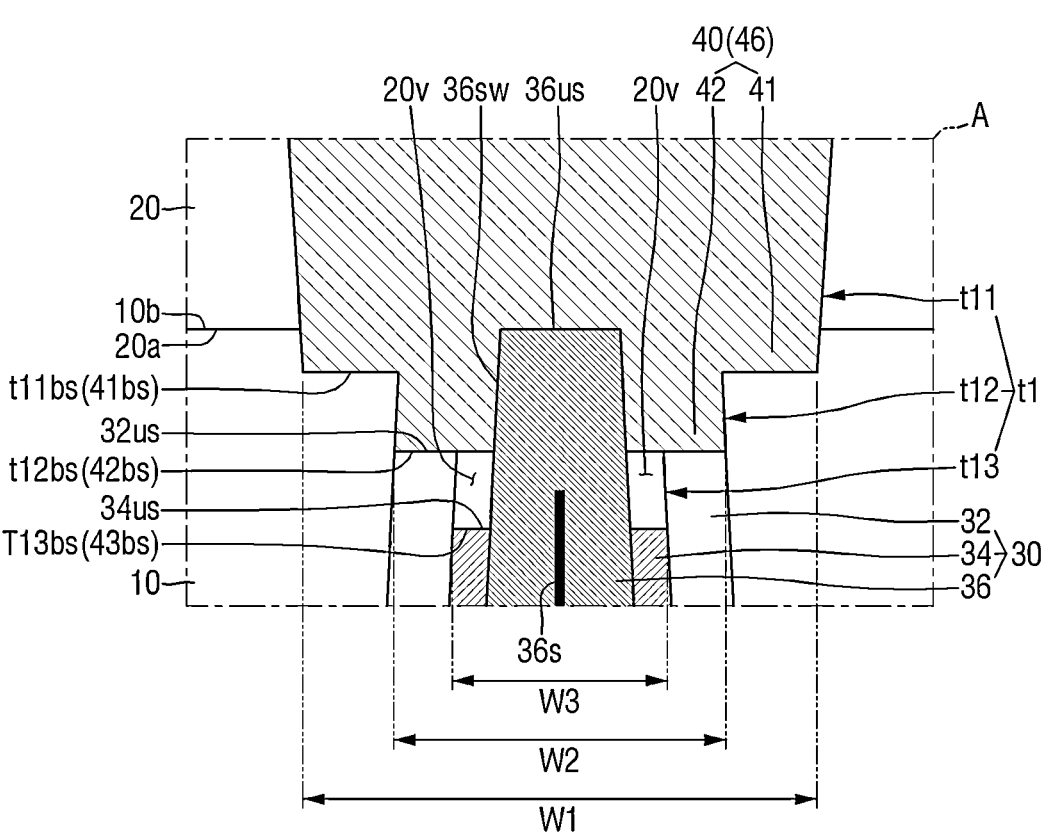

FIG. 1 is a diagram for explaining a semiconductor device according to some example embodiments. FIGS. 2 and 3 are enlarged views of a portion A of FIG. 1.

Referring to FIGS. 1 to 3, a semiconductor device according to some example embodiments may include a first film 10, a second film 20, a via 30, and a wiring 40.

The first film 10 may include a first side 10$a$ and a second side 10$b$ that are opposite to each other. In some example embodiments, the first film 10 may be a semiconductor substrate. For example, the first film 10 may be bulk silicon or silicon-on-insulator (SOI). The first film 10 may be a silicon substrate, or may include, but is not limited to, other materials, for example, silicon germanium, SGOI (silicon germanium on insulator), indium antimonide, lead tellurium, indium arsenide, indium phosphide, gallium arsenide or gallium antimonide. In some example embodiments, the first film 10 may include an insulating material. For example, the first film 10 may include at least one of silicon oxide, silicon nitride, silicon oxynitride, and a low dielectric constant material.

The second film 20 may be placed on the second side 10$b$ of the first film 10. The second film 20 may include a third side 20$a$ and a fourth side 20$b$ that are opposite to each other. The fourth side 20$b$ of the second film 20 may be in contact with the second side 10$b$ of the first film 10. The second film 20 may include an insulating material. For example, the second film 20 may include at least one of silicon oxide, silicon nitride, silicon oxynitride, and a low dielectric constant material.

In the following description, an upper face, an uppermost face, an upper side, a lower face, a lowermost face, and a lower part are based on a direction facing from the first film 10 to the second film 20 or a direction facing from the via 30 to the wiring 40, for example, a third direction DR3. A first direction DR1 and a second direction DR2 may intersect each other in a direction parallel to the first side 10$a$ of the first film 10. The third direction DR3 may intersect the first and second directions DR1 and DR2.

The first film 10 and the second film 10 may define parts of a trench t1. The trench t1 may be placed inside the second film 20 and the first film 10. The trench t1 may extend from the fourth side 20$b$ of the second film 20 toward the first film 10. The trench t1 may penetrate the second film 20, and a bottom face of the trench t1 may be placed in the second film

20. The bottom face of the trench t1 may be placed below the third side 20$a$ of the second film 20. The bottom face of the trench t1 may have a step.

A width of the trench t1 in the first direction DR1 may decrease toward the first film 10.

In some example embodiments, the trench t1 may include a first sub-trench t11, a second sub-trench t12, and a third sub-trench t13.

The first sub-trench t11 may have a first width W1. The second sub-trench t12 may be placed below the first sub-trench t11. The second sub-trench t12 may be formed on a bottom face t11$bs$ of the first sub-trench t11. The second sub-trench t12 may have a second width W2 that is smaller than the first width W1. The third sub-trench t13 may be placed below the second sub-trench t12. The third sub-trench t13 may be formed on a bottom face t12$bs$ of the second sub-trench t12. The third sub-trench t13 may have a third width W3 that is smaller than the second width W2. The bottom face t11$bs$ of the first sub-trench t11 may be placed below the third side 20$a$ of the second film 20, the bottom face t12$bs$ of the second sub-trench t12 may be placed below the bottom face t11$bs$ of the second first sub-trench t11, and the bottom face t13$bs$ of the third sub-trench t13 may be placed below the bottom face t12$bs$ of the second sub-trench t12. The first to third widths W1, W2 and W3 may each mean widths of each of the bottom faces t11$bs$, t12$bs$ and t13$bs$ of the first to third sub-trench t11, t12 and t13 in the first direction DR1.

The via 30 may be placed in the first film 10. The via 30 may extend from the first side 10$a$ of first film 10 toward the second film 20. An upper face of the via 30 may have a step.

In some example embodiments, the via 30 may include an insulating liner 32, a first barrier conductive film 34, and a first plug conductive film 36.

The first plug conductive film 36 may extend from the first side 10$a$ of the first film 10 to penetrate the bottom face of the trench t1. The first plug conductive film 36 may penetrate the bottom face t13$bs$ of the third sub-trench t13. The upper face 36$us$ of the first plug conductive film 36 may be placed above the bottom face t13$bs$ of the third sub-trench t13 and the bottom face t12$bs$ of the second sub-trench t12. The upper face 36$us$ of the first plug conductive film 36 and a part of the side wall 36$sw$ of the first plug conductive film 36 may be placed inside the trench t1. The upper face 36$us$ of the first plug conductive film 36 and a part of the side wall 36$sw$ of the first plug conductive film 36 may be exposed by the trench t1. The upper face 36$us$ of the first plug conductive film 36 may be the uppermost face of the first plug conductive film 36.

The width of the first plug conductive film 36 in the first direction DR1 may decrease toward the second film 20.

In some example embodiments, the first plug conductive film 36 may include a seam 36$s$ therein. The seam 36$s$ may extend in the third direction DR3.

The first plug conductive film 36 may include, for example, at least one of aluminum (Al), tungsten (W), cobalt (Co), ruthenium (Ru), silver (Ag), gold (Au), manganese (Mn) and molybdenum (Mo).

The first barrier conductive film 34 may be placed between the first plug conductive film 36 and the insulating liner 32. The first barrier conductive film 34 may extend from the first side 10$a$ of the first film 10 along at least a part of the side wall 36$sw$ of the first plug conductive film 36. The upper face 34$us$ of the first barrier conductive film 34 may be placed below the upper face 36$us$ of the first plug conductive film 36 and the upper face 32$us$ of the insulating liner 32. The upper face 34us of the first barrier conductive film 34 may be exposed by the bottom face t13bs of the third sub-trench t13.

The first barrier conductive film 34 may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and two-dimensional materials (2D materials).

The insulating liner 32 may be placed between the first plug conductive film 36 and the first film 10. The insulating liner 32 may be placed on at least a part of the side walls 36sw of the first plug conductive film 36. The insulating liner 32 extends from the first side 10a of the first film 10, and the upper face 32us of the insulating liner 32 may be placed below the upper face 36us of the first plug conductive film 36. The upper face 32us of the insulating liner 32 may be exposed by the bottom face t12bs of the second sub-trench t12.

The insulating liner 32 may include, for example, but is not limited to, at least one of silicon oxide, silicon nitride, silicon oxynitride, silicon oxycarbonitride or combinations thereof.

The wiring 40 extends from the fourth side 20b of the second film 20 toward the first film 10, and a bottom face thereof may be placed inside the first film 10. The wiring 40 may be placed inside the trench t1. The wiring 40 may fill at least a part of the trench t1. The width of the wiring 40 in the first direction DR1 may decrease toward the first film 10.

In some example embodiments, the wiring 40 may have a single conductive film structure. The wiring 40 may include a second plug conductive film 46. The second plug conductive film 46 may include, for example, at least one of aluminum (Al), tungsten (W), cobalt (Co), copper (Cu), ruthenium (Ru), silver (Ag), gold (Au), manganese (Mn) and molybdenum (Mo).

In some example embodiments, the wiring 40 may not include an insulating liner. In some example embodiments, the wiring 40 may further include an insulating liner. The insulating liner may extend along the side walls of the second plug conductive film 46. The insulating liner may include an insulating material for electrically isolating the second plug conductive film 46 and the first and second films 10 and 20.

Referring to FIG. 2, in some example embodiments, the wiring 40 may fill the trench t1. Therefore, the wiring 40 may include a first portion 41, a second portion 42 having a width smaller than the first portion 41 below the first portion 41, and a third portion 43 having a width smaller than the second portion 42 below the second portion 42. For example, the first portion 41 may have a third width W3, the second portion 42 may have a second width W2, and the third portion 43 may have a first width W1. A lower face of the wiring 40 may have a step.

The wiring 40 may be in contact with the upper face 36us of the first plug conductive film 36 and at least a part of the side wall 36sw of the first plug conductive film 36. The wiring 40 may be in contact with the upper face 36us and the side walls 36sw of the first plug conductive film 36 exposed by the trench t1. That is, the first plug conductive film 36 may penetrate through the bottom face of the third portion 43 of the wiring 40, and the upper part of the first plug conductive film 36 may be placed inside the wiring 40 and be in contact with the wiring 40. Accordingly, the via 30 may be electrically connected to the wiring 40.

The wiring 40 may fill the trench t1 to come into contact with the upper face 32us of the insulating liner 32 and the upper face 34us of the first barrier conductive film 34.

Referring to FIG. 3, in some example embodiments, the wiring 40 may fill a part of the trench t1. A void 20v may be formed between the wiring 40 and the first barrier conductive film 34. The void 20v may be formed when the wiring 40 does not completely fill the trench t1 in the process of forming the wiring 40. The shape and placement of the void 20v are not limited to those shown in FIG. 3, and may vary.

For example, the wiring 40 may include a first portion 41, and a second portion 42 having a smaller width than the first portion 41 below the first portion 41. The void 20v may be formed between the second portion 42 of the wiring 40 and the first barrier conductive film 34.

In the semiconductor device according to some example embodiments, since the wiring 40 is in direct contact with the first plug conductive film 36 of the via 30, an interfacial resistance may be reduced, as compared with a case where the first barrier conductive film 34 is placed between the wiring 40 and the first plug conductive film 36, and the wiring 40 is in contact with the first barrier conductive film 34. In addition, since the wiring 40 is in contact with the upper face 36us and a part of the side wall 36sw of the first plug conductive film 36, a contact area between the wiring 40 and the first plug conductive film 36 increases, and the interfacial resistance may decrease.

Figure 4:
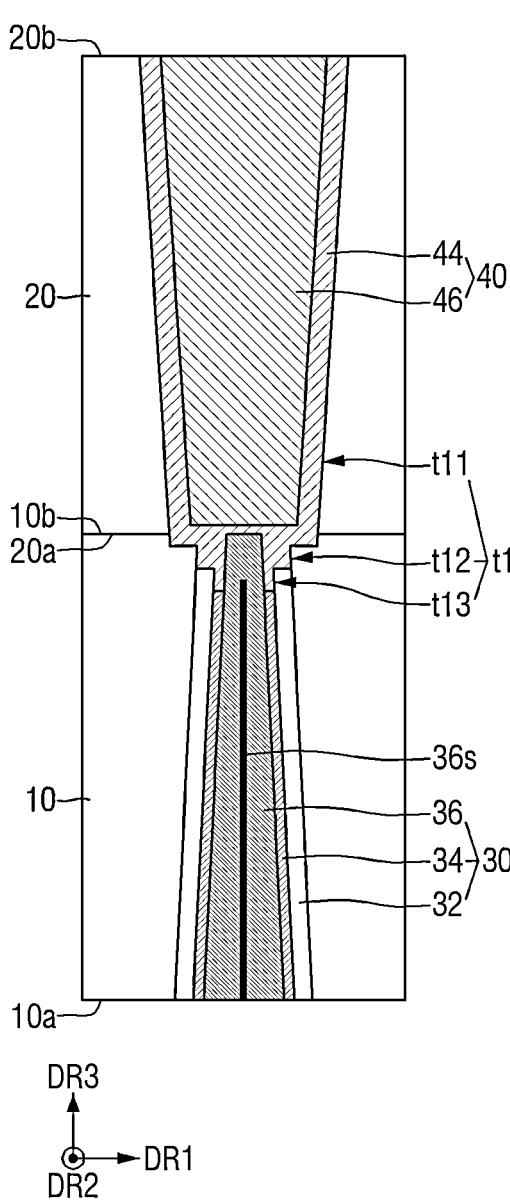
FIG. 4 is a diagram for explaining a semiconductor device according to some example embodiments.

FIG. 4 is a diagram for explaining a semiconductor device according to some example embodiments. For convenience of explanation, points that are different from those explained using FIGS. 1 to 3 will be mainly explained.

Referring to FIG. 4, in the semiconductor device according to some example embodiments, the wiring 40 may have multiple conductive film structures. The wiring 40 may include a second barrier conductive film 44 and a second plug conductive film 46.

The second barrier conductive film 44 may extend along the side walls and bottom face of the trench t1. The second barrier conductive film 44 may extend along bottom faces t11bs, t12bs and t13bs of each of the first to third sub-trench t11, t12 and t13. The second barrier conductive film 44 may be in contact with the upper face 32us of the insulating liner 32 and the upper face 34us of the first barrier conductive film 34. For example, the second barrier conductive film 44 may fill the second sub-trench t12 and the third sub-trench t13, and may be in contact with the upper face 36us of the first plug conductive film 36. Alternatively, unlike this, the upper face 36us of the first plug conductive film 36 may be placed inside the second plug conductive film 46, and the upper face 36us of the first plug conductive film 36 may be in contact with the second plug conductive film 46.

The second barrier conductive film 44 may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and two-dimensional materials (2D materials).

The second plug conductive film 46 may be placed on the second barrier conductive film 44. The second plug conductive film 46 may fill the trench t1 on the second barrier conductive film 44.

Figure 5:
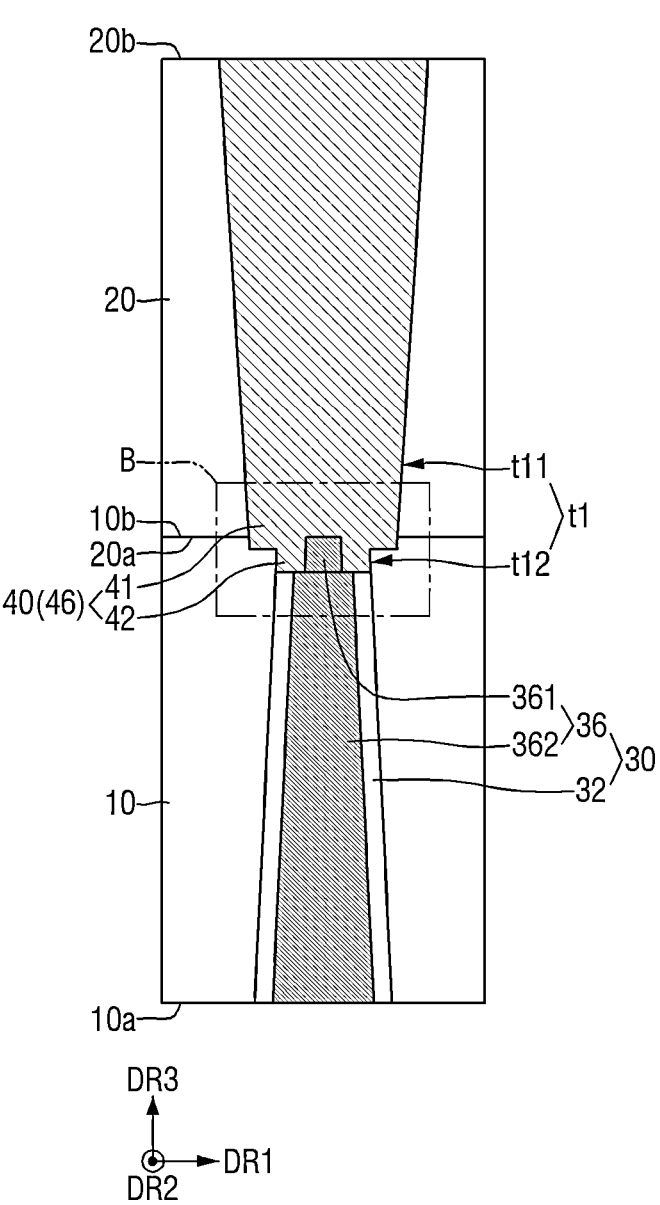
FIG. 5 is a diagram for explaining a semiconductor device according to some example embodiments.

FIG. 5 is a diagram for explaining a semiconductor device according to some example embodiments. FIGS. 6 to 10 are enlarged views of a portion B of FIG. 5.

Referring to FIGS. 5 to 10, in some example embodiments, the via 30 may include an insulating liner 32 and a first plug conductive film 36.

The first plug conductive film 36 may include a first portion 361, and a second portion 362 placed below the first portion 361. An upper face 361us of the first portion 361 may be the upper face 36us of the first plug conductive film 36. The first portion 361 may have a fourth width W4. The fourth width W4 may be smaller than the second width W2. The second portion 362 may have a fifth width W5 smaller than the fourth width W4. The fourth width W4 may be a width of the lower face of the first portion 361 in the first direction DR1, and the fifth width W5 may be a width of the upper face of the second portion 362 in the first direction DR1. The fourth and fifth widths W4 and W5 may each be widths of the first and second portions 361 and 362 in the first direction DR1 at a boundary between the first and second portions 361 and 362. That is, the first portion 361 and the second portion 362 may have a step at the boundary.

In some example embodiments, a grain size of the first portion 361 may be different from the grain size of the second portion 362. The grain size of the first portion 361 may be smaller than the grain size of the second portion 362. This may be attributed to the manufacturing process of the first plug conductive film 36.

In some example embodiments, the first portion 361 may include the same material as the second portion 362. In some example embodiments, the first portion 361 may include a different material from the second portion 362.

The insulating liner 32 may extend along at least a part of the side walls 361sw and 362sw of the first plug conductive film 36. The insulating liner 32 may be in contact with the first plug conductive film 36. The insulating liner 32 may extend along at least a part of the side wall 362sw of the second portion 362.

In the semiconductor devices according to some example embodiments, the trench t1 may include a first sub-trench t11 and a second sub-trench t12. The first portion 361 may penetrate the bottom face t12bs of the second sub-trench t12. The upper face 361us of the first portion 361 and the side walls 361sw of the first portion 361 may be exposed by the trench t1. The upper face 32us of the insulating liner 32 may be exposed by the second sub-trench t12.

Figure 6:
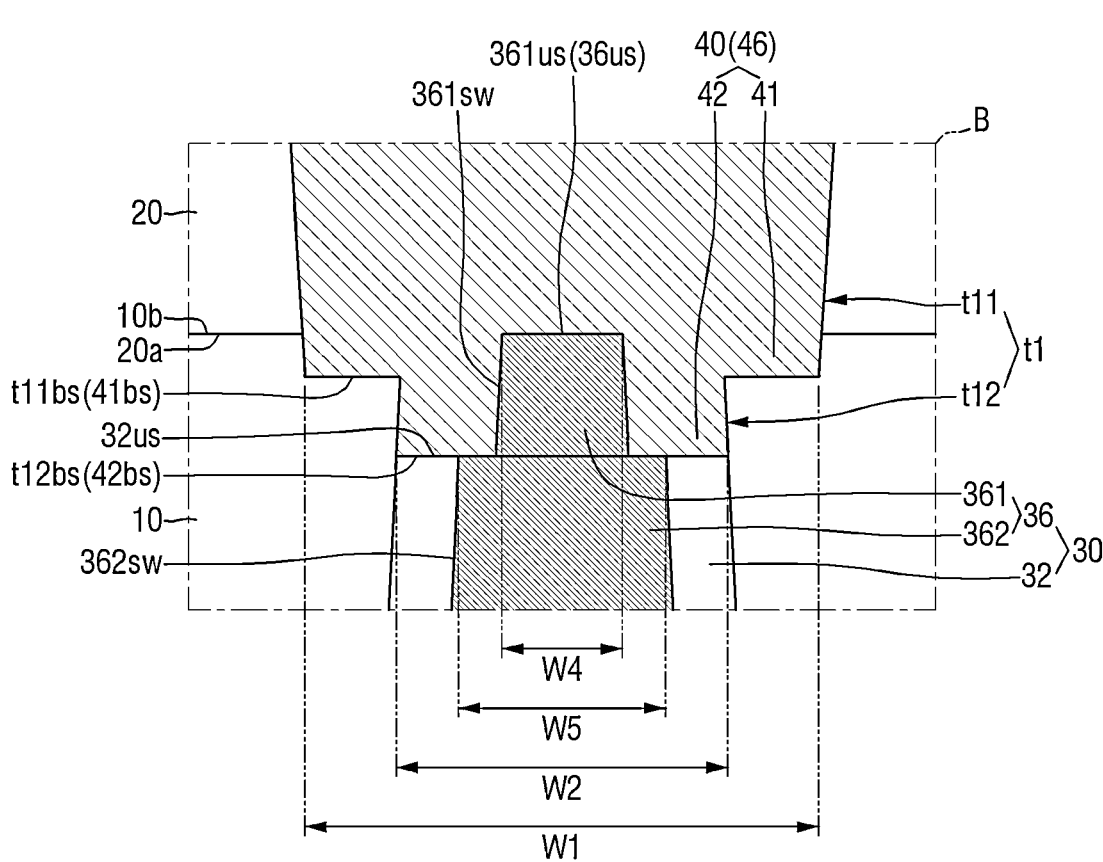
FIGS. 6 to 10 are enlarged views of a portion B of FIG. 5.

Referring to FIG. 6, in some example embodiments, the wiring 40 fills the trench t1, and may include a first portion 41, and a second portion 42 having a width smaller than the first portion 41 below the first portion 41. The first plug conductive film 36 may penetrate through the second portion 42.

The wiring 40 may be in contact with the upper face 361us of the first portion 361 of the first plug conductive film 36 and the side wall 361sw of the first portion 361 of the first plug conductive film 36. The wiring 40 may be in contact with the upper face 362us of the second portion 362 of the first plug conductive film 36. The wiring 40 may be in contact with the upper face 32us of the insulating liner 32.

Figure 7:
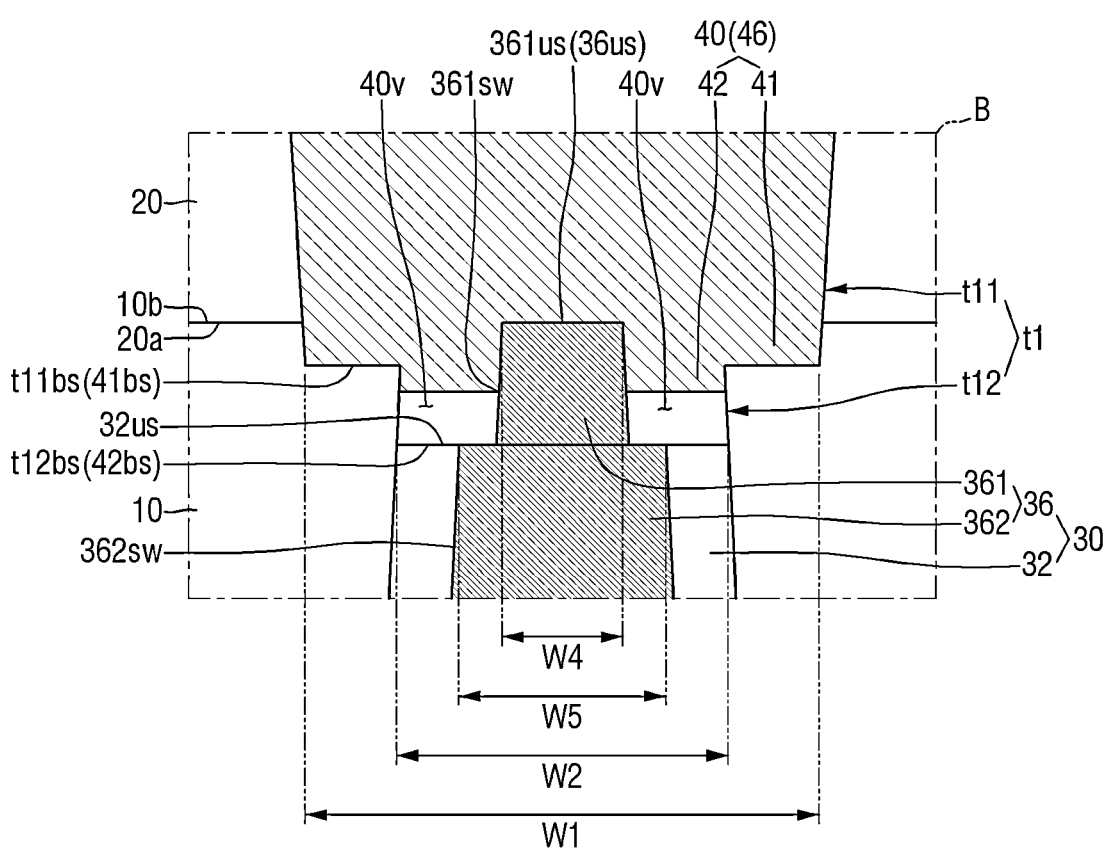

Referring to FIG. 7, in some example embodiments, the wiring 40 may be in contact with the upper face 361us of the first portion 361 and a part of the side walls 361sw of the first portion 361. A void 40v may be formed between the wiring 40 and the insulating liner 32. The shape and placement of the void 40v are not limited to those shown in FIG. 7, and may vary.

Figure 8:
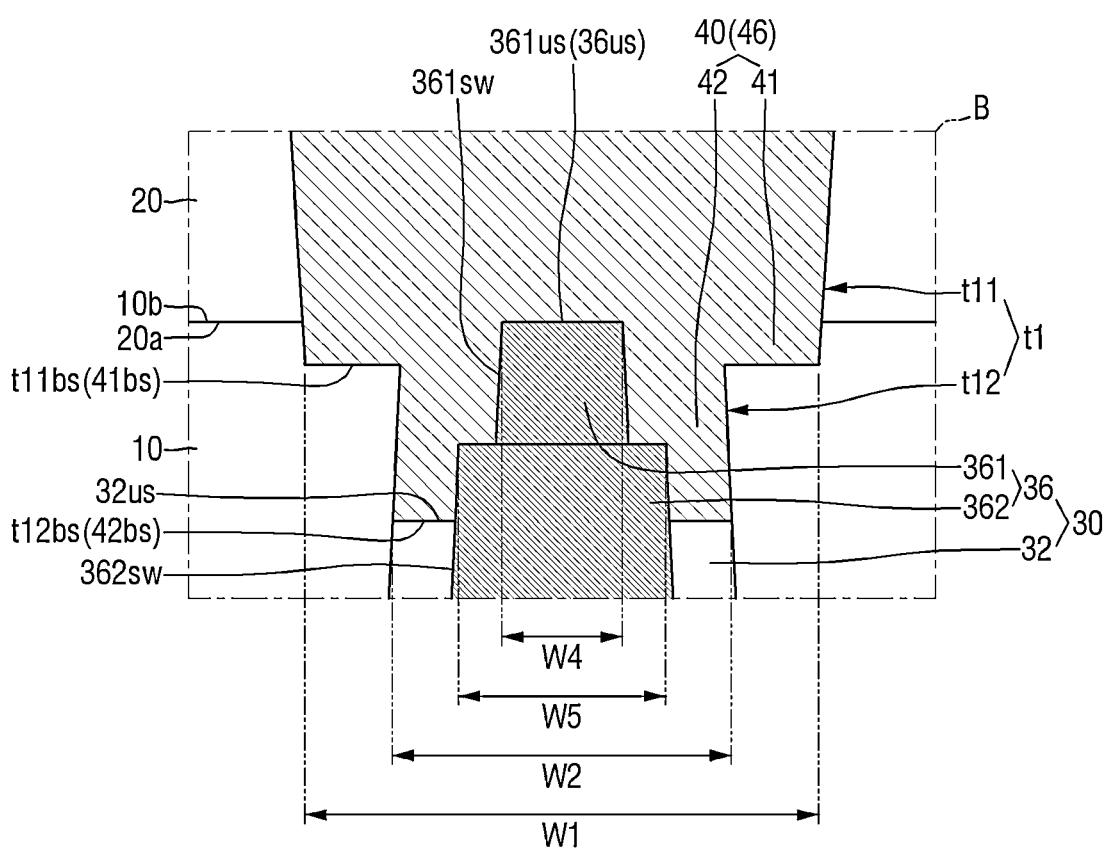
Figure 9:
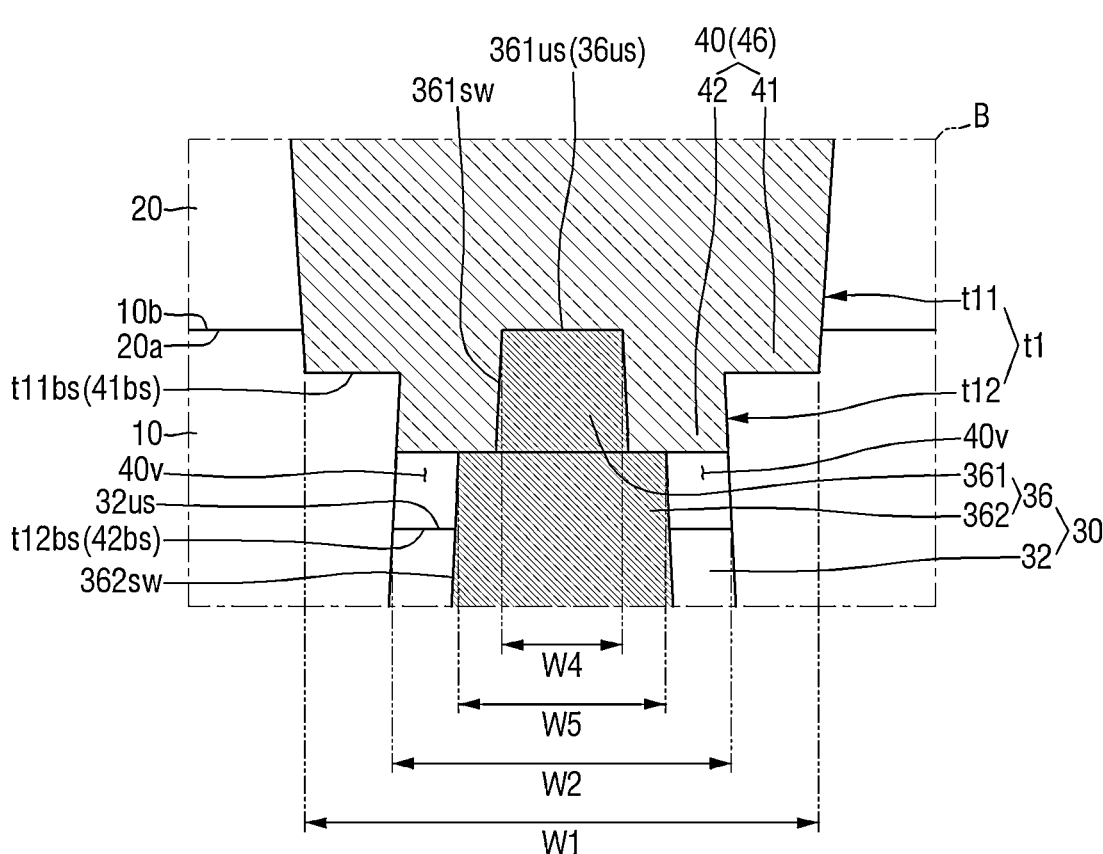

Referring to FIGS. 8 and 9, unlike FIG. 6, in some example embodiments, the bottom face t12bs of the second sub-trench t12 may be placed below an interface between the first portion 361 and the second portion 362. That is, a part of the side wall 362sw of the second portion 362 may be further exposed by the trench t1.

The wiring 40 may be in contact with the upper face 361us of the first portion 361, the side walls 361sw of the first portion 361, the upper face 362us of the second portion 362, and a part of the side walls 362sw of the second portion 362. The wiring 40 may be in contact with the upper face 32us of the insulating liner 32.

Referring to FIG. 9, in some example embodiments, the void 40v may be formed between the wiring 40 and the insulating liner 32. The shape and placement of the void 40v are not limited to those shown in FIG. 9, and may vary.

Figure 10:
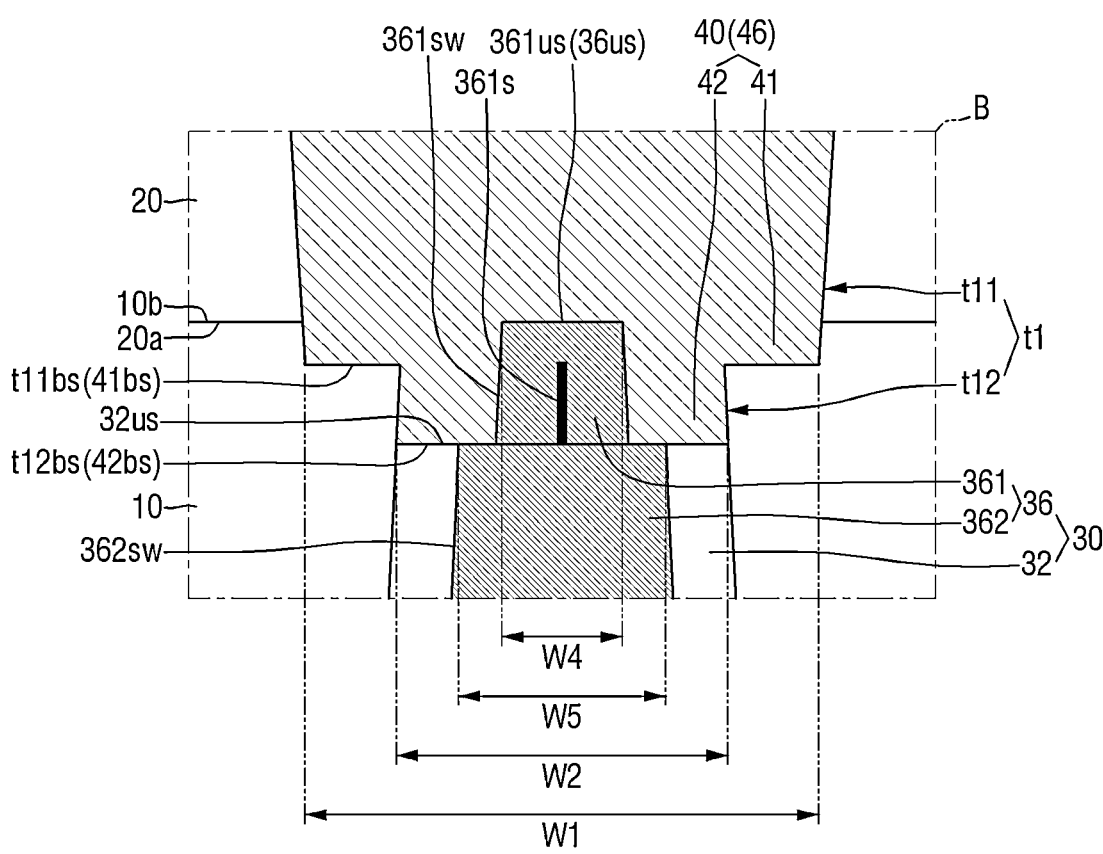

Referring to FIGS. 6 to 9, in some example embodiments, the first plug conductive film 36 may not include a seam inside. Referring to FIG. 10, in some example embodiments, the first portion 361 includes a seam 361s inside, but the second portion 362 may not include a seam inside.

Figure 11:
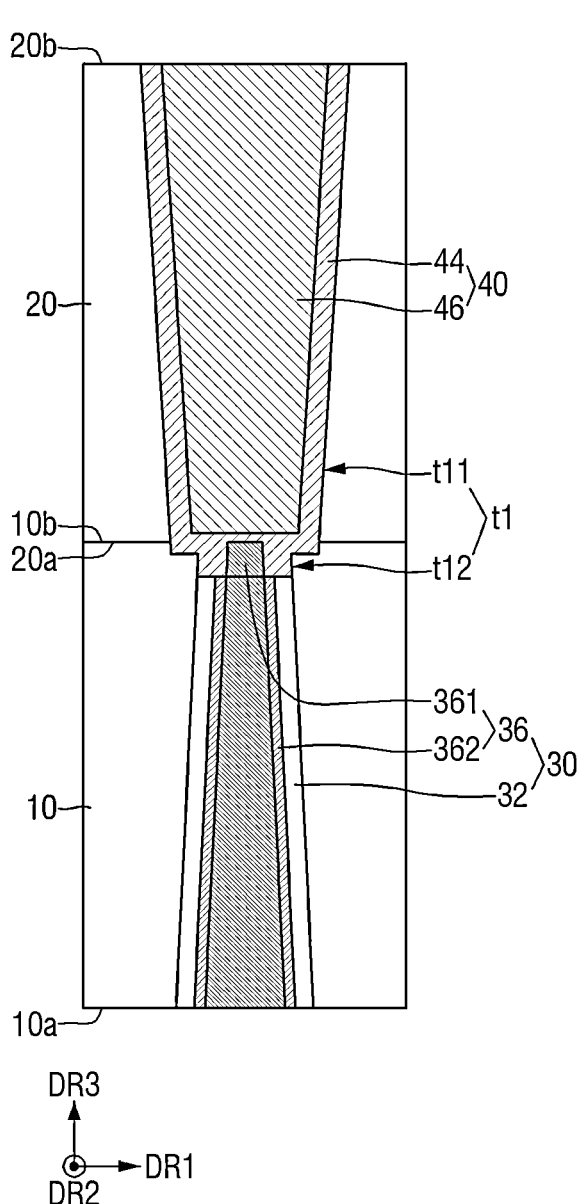
FIG. 11 is a diagram for explaining a semiconductor device according to some example embodiments.

FIG. 11 is a diagram for explaining a semiconductor device according to some example embodiments. For convenience of explanation, points that are different from those explained using FIGS. 1 to 10 will be mainly explained.

Referring to FIG. 11, in the semiconductor device according to some example embodiments, the wiring 40 may have multiple conductive film structures. The wiring 40 may include a second barrier conductive film 44 and a second plug conductive film 46. The second barrier conductive film 44 may extend along bottom faces t11bs and t12bs of each of the first and second sub-trench t11 and t12. The second barrier conductive film 44 may be in contact with the upper face 32us of the insulating liner 32 and the upper face 34us of the first barrier conductive film 34. For example, the second barrier conductive film 44 may fill the second sub-trench t12, and may be in contact with the upper face 36us of the first plug conductive film 36. Alternatively, unlike this, the upper face 36us of the first plug conductive film 36 may be placed inside the second plug conductive film 46, and the upper face 36us of the first plug conductive film 36 may be in contact with the second plug conductive film 46.

FIGS. 12 to 15 are intermediate operation diagrams for describing a method of manufacturing the semiconductor device according to some example embodiments.

Figure 12:
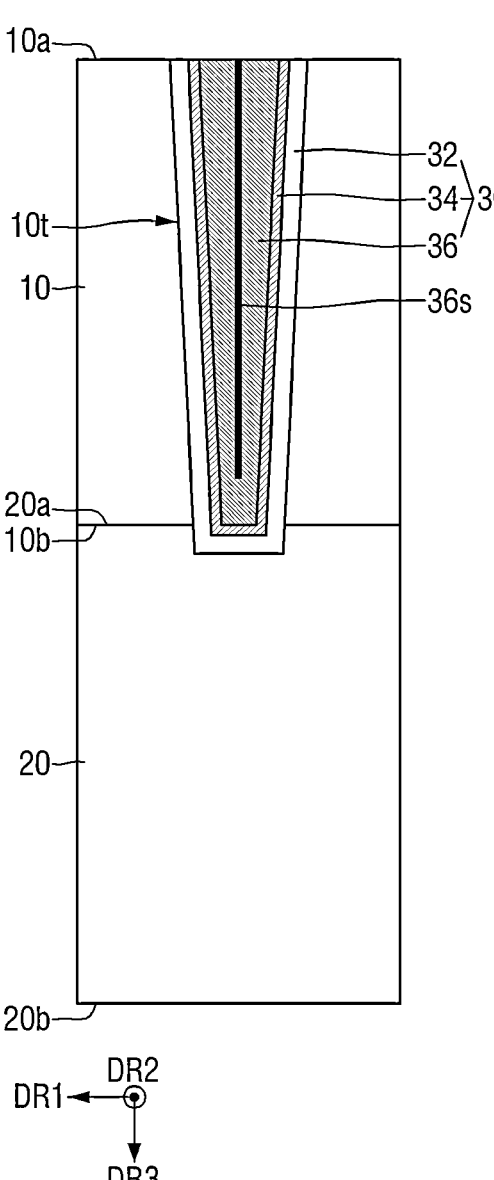
FIGS. 12 to 15 are intermediate operation diagrams for describing a method of manufacturing the semiconductor device according to some example embodiments.

Referring to FIG. 12, a second film 20 including a third side 20a and a fourth side 20b may be provided. A first film 10 including a first side 10a and a second side 10b may be provided on the third side 20a of the second film 20. The first film 10 may be placed on the third side 20a of the second film 20.

A trench 10t may be formed inside the first film 10. The trench 10t may extend from the first side 10a of the first film 10 toward the second side 10b and penetrate through the first film 10. For example, the bottom face of the trench 10t may be placed inside the second film 20.

An insulating liner 32 extending along the side walls and bottom face of the trench 10t may be formed. A first barrier conductive film 34 extending along the insulating liner 32 may be formed on the insulating liner 32. The insulating liner 32 and the first barrier conductive film 34 may be conformally formed. A first plug conductive film 36 may be formed on the first barrier conductive film 34. The first plug conductive film 36 may fill the trench 10t that remains after the insulating liner 32 and the first barrier conductive film 34 are formed. The first plug conductive film 36 may include a seam 36s inside.

Figure 13:
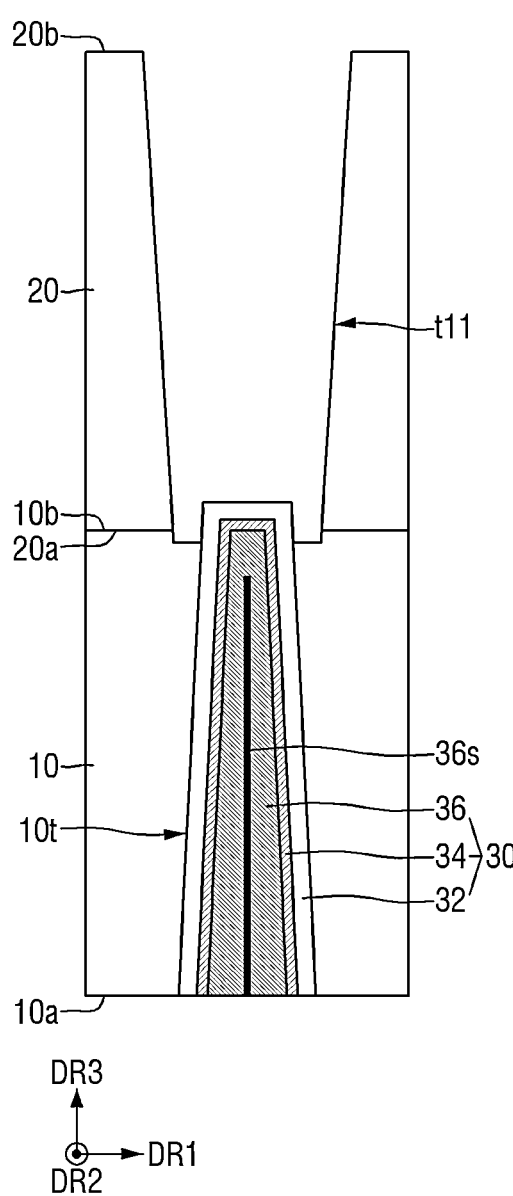

Referring to FIG. 13, a first sub-trench t11 may be formed in the second film 20. The first sub-trench t11 may extend from the fourth side 20b of the second film 20 toward the third side 20a. The first sub-trench t11 may expose at least a part of the via 30. That is, the via 30 may have a shape penetrating through the bottom face of the first sub-trench t11. The insulating liner 32 of the via 30 may be exposed by the first sub-trench t11.

Alternatively, in a case where the second film 20 is a substrate, the substrate may be removed and an insulating material may be applied. The second film 20 including the insulating material may be formed, accordingly. Next, the above-described first sub-trench t11 may be formed.

Figure 14:
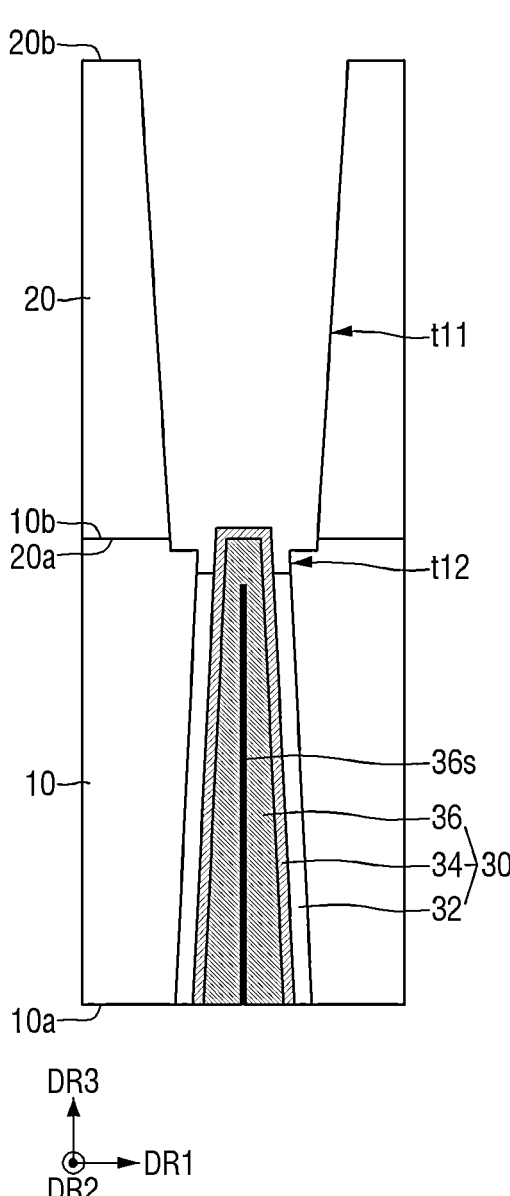

Referring to FIG. 14, the insulating liner 32 exposed by the first sub-trench t11 may be removed. The insulating liner 32 may be removed by a dry etching process or a wet etching process.

The upper face of the insulating liner 32 may be placed below the bottom face of the first sub-trench t11. Accordingly, the second sub-trench t12 may be formed under the first sub-trench t11. That is, the via 30 may have a shape penetrating through the bottom face of the second sub-trench t12. The first barrier conductive film 34 and the insulating liner 32 of the via 30 may be exposed by the first and second sub-trench t11 and t12.

Figure 15:
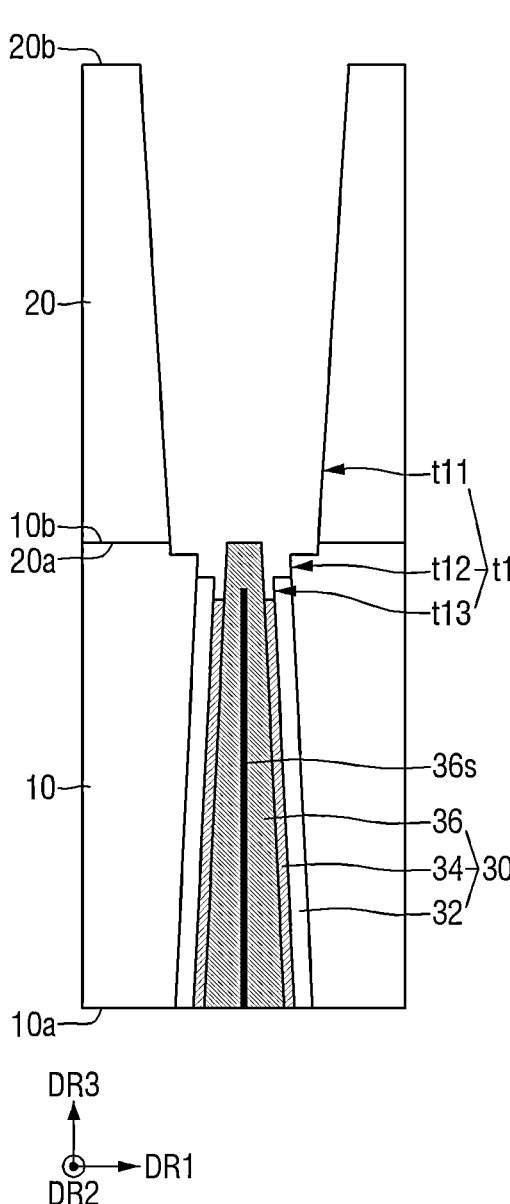

Referring to FIG. 15, the first barrier conductive film 34 exposed by the first and second sub-trench t11 and t12 may be removed. The first barrier conductive film 34 may be removed by a dry etching process or a wet etching process.

The upper face of the first barrier conductive film 34 may be placed below the bottom face of the second sub-trench t12. Accordingly, the third sub-trench t13 may be formed under the second sub-trench t12, and the trench t1 including the first to third sub-trench t11, t12 and t13 may be formed. That is, the via 30 may have a shape penetrating through the bottom face of the third sub-trench t13. The upper face of the via 30 may be exposed by the trench t1.

Next, referring to FIG. 1, a wiring 40 that fills the trench t1 may be formed. The wiring 40 may be formed by a selective bottom up metal fill manner, on the basis of the first plug conductive film 36 exposed by the trench t1. Alternatively, referring to FIG. 4, after forming the second barrier conductive film 44, a second plug conductive film 46 may be formed on the second barrier conductive film 44.

Alternatively, after forming an insulating liner that extends along the side walls and bottom face of trench t1, the lower face of the insulating liner may be removed to expose the upper face of the via 30. Subsequently, the second plug conductive film 46 that fills the trench t1 that remains after the insulating liner is formed, or the second barrier conductive film 44 and the second plug conductive film 46 may be formed. The wiring 40 including an insulating liner may be formed, accordingly.

Figure 16:
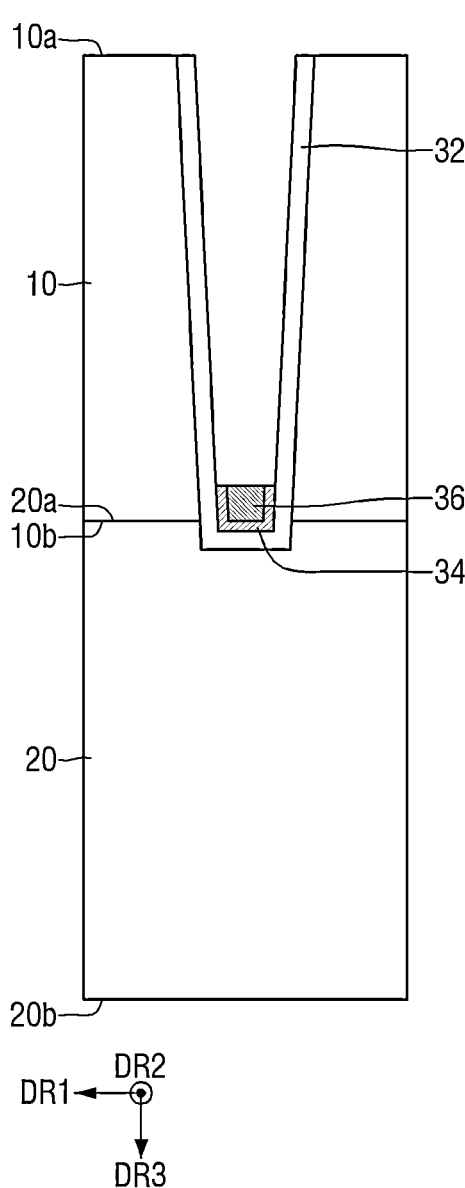
FIGS. 16 to 18 are intermediate operation diagrams for explaining the method of manufacturing the semiconductor device according to some example embodiments.
Figure 17:
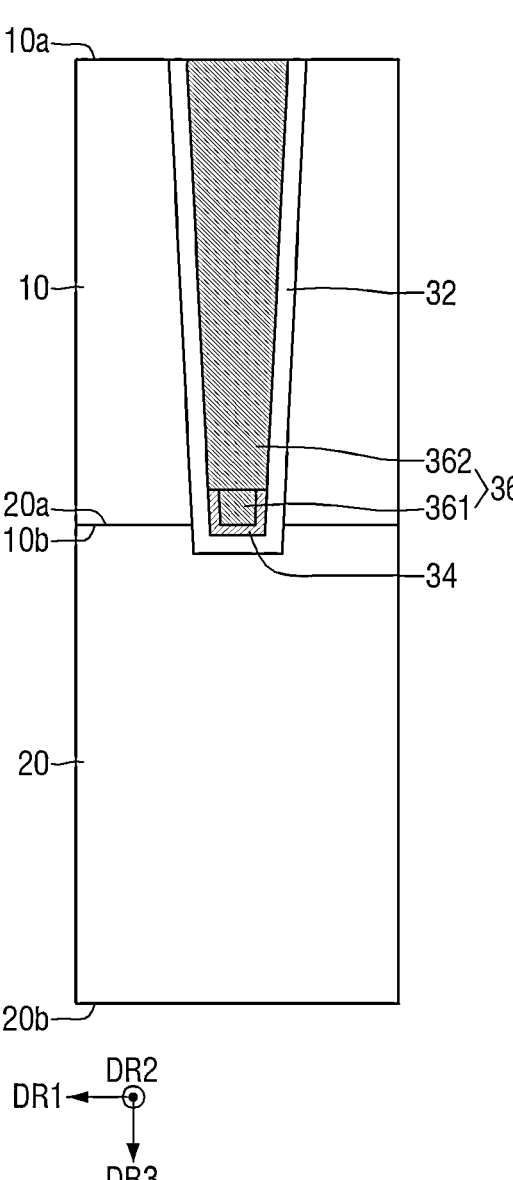
Figure 18:
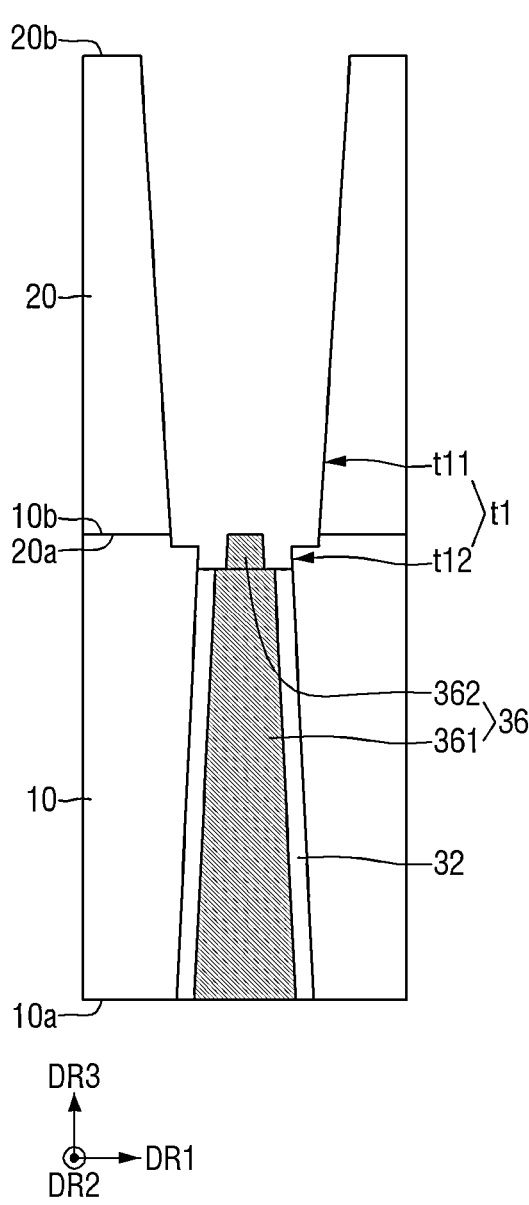

FIGS. 16 to 18 are intermediate operation diagrams for explaining a method of manufacturing the semiconductor device according to some example embodiments. FIG. 16 is an intermediate step diagram for explaining steps after FIG. 12.

Referring to FIGS. 12 and 16, a part of the first barrier conductive film 34 and a part of the first plug conductive film 36 may be removed. This may be performed by an etch-back process. The first portion 361 of the first plug conductive film 36 may remain.

At this time, all the seams 36s in the first plug conductive films 36 may be removed. Alternatively, the seam 36s may remain inside the first portion 361.

Referring to FIG. 17, a second portion 362 of the first plug conductive film 36 may be formed on the first portion 361 of the first plug conductive film 36. The second portion 362 may be formed by an optional bottom-up metal fill manner, on the basis of the first portion 361. The second portion 362 may be formed without the barrier conductive film, and the grain size of the second portion 362 may be greater than the grain size of the first portion 361. As a result, the first plug conductive film 36 which has a larger volume, a relatively larger grain size, no seam inside, and a low resistance may be formed, as compared to a case where the barrier conductive film is present.

Referring to FIG. 18, a first sub-trench t11 may be formed in the second film 20. The first sub-trench t11 may extend from the fourth side 20b of the second film 20 toward the third side 20a and expose the insulating liner 32 of the via 30.

The insulating liner 32 exposed by the first sub-trench t11 may then be removed. The insulating liner 32 may be removed by a dry etching process or a wet etching process. Accordingly, the second sub-trench t12 may be formed under the first sub-trench t11. The upper face of the via 30 may be exposed by the trench t1.

Next, referring to FIG. 5, the wiring 40 that fills the trench t1 may be formed. The wiring 40 may be formed by a selective bottom-up metal fill manner, on the basis of the first plug conductive film 36 exposed by the trench t1. Alternatively, referring to FIG. 11, after forming the second barrier conductive film 44, the second plug conductive film 46 may be formed on the second barrier conductive film 44.

Alternatively, after forming an insulating liner that extends along the side walls and bottom face of the trench t1, the lower face of the insulating liner may be removed to expose the upper face of the via 30. Subsequently, the second plug conductive film 46 that fills the trench t1 that remains after forming the insulating liner, or the second barrier conductive film 44 and the second plug conductive film 46 may be formed. The wiring 40 including the insulating liner may be formed, accordingly.

Figure 19:
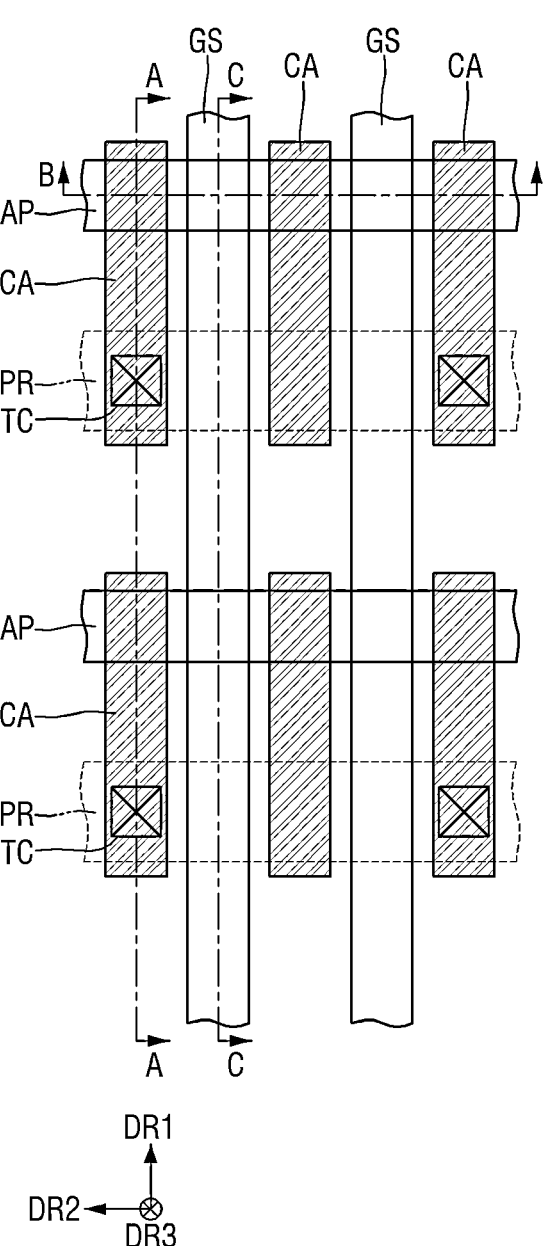
FIG. 19 is a layout diagram for explaining a semiconductor device according to some example embodiments.
Figure 20:
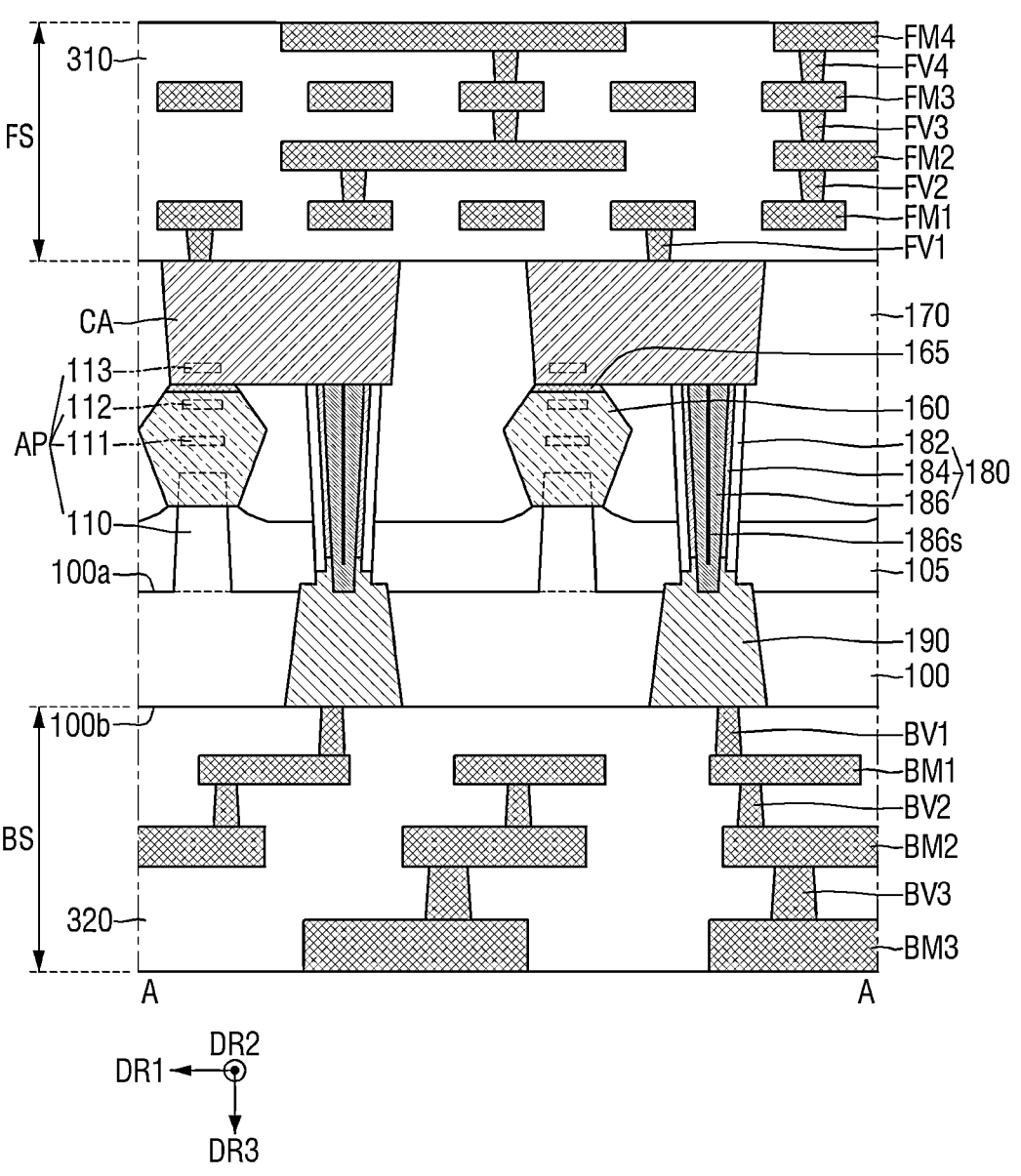
FIGS. 20 and 23 are schematic cross-sectional views taken along A-A of FIG. 19.
Figure 21:
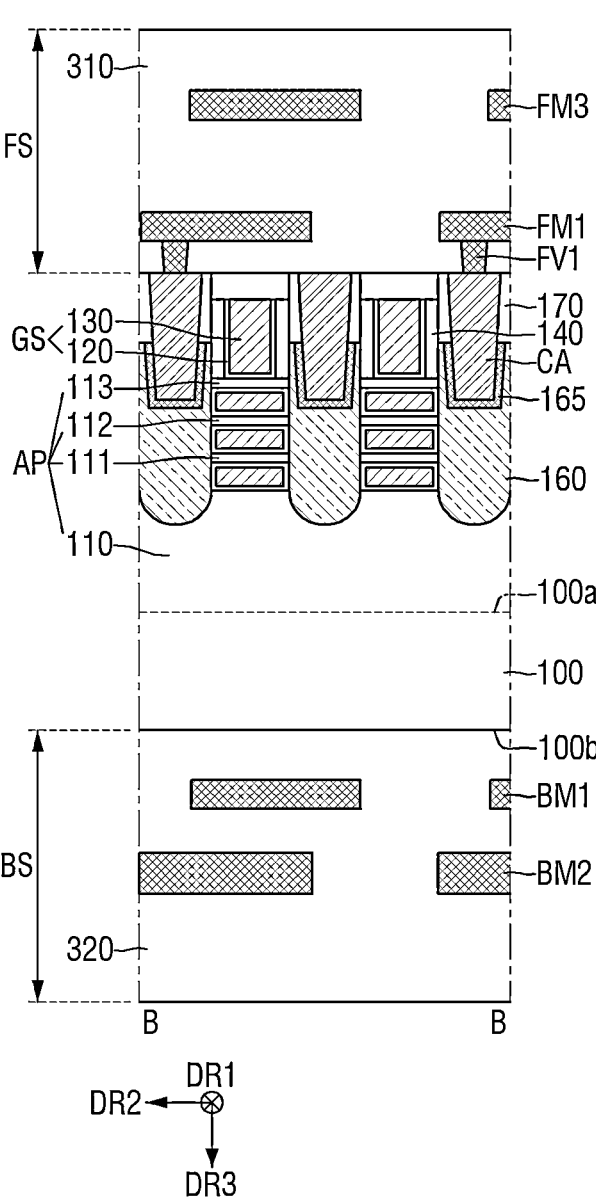
FIG. 21 is a schematic cross-sectional view taken along B-B of FIG. 19.
Figure 22:
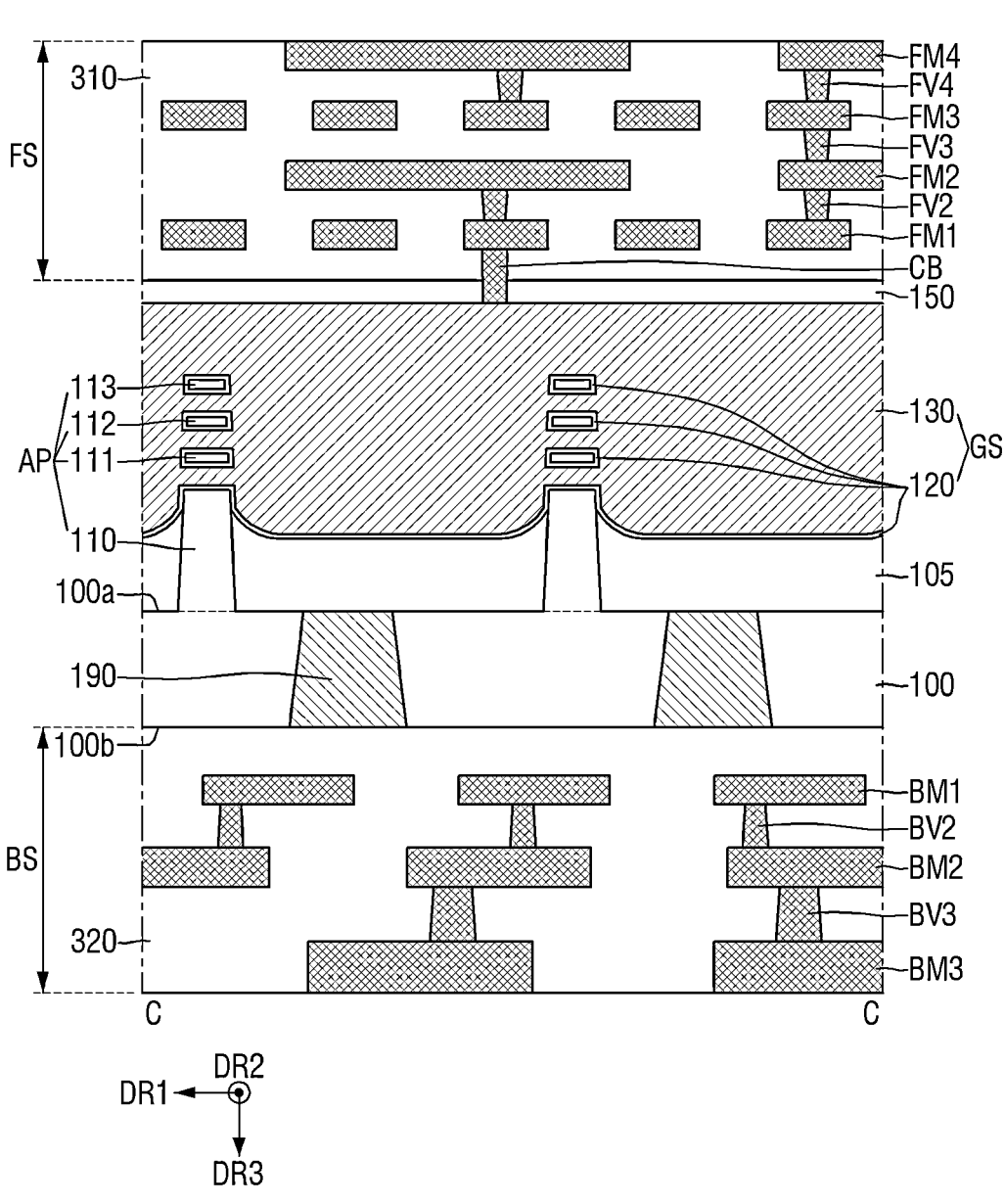
FIG. 22 is a schematic cross-sectional view taken along C-C of FIG. 19.
Figure 23:
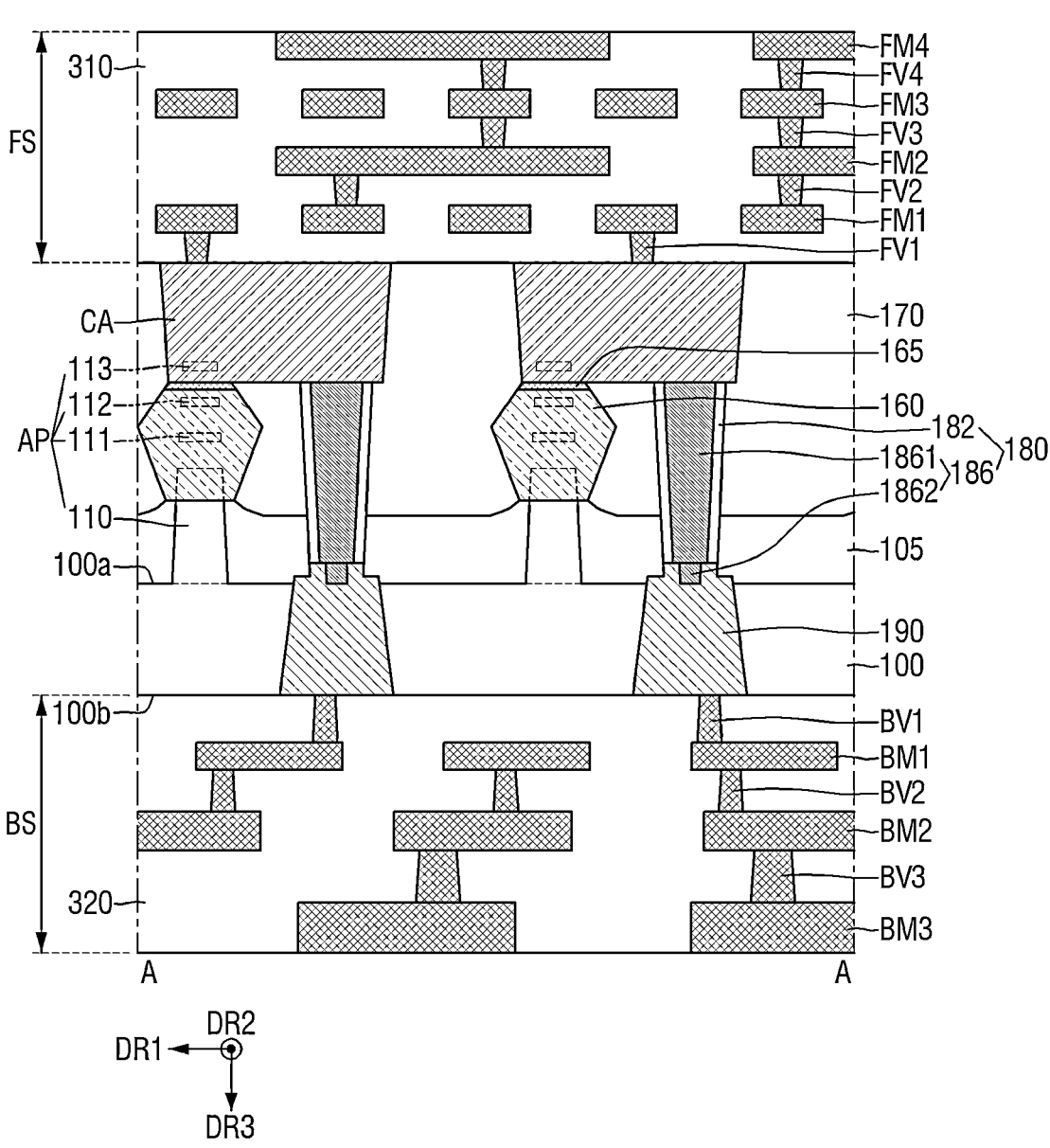

FIG. 19 is a layout diagram for explaining a semiconductor device according to some example embodiments. FIGS. 20 and 23 are schematic cross-sectional views taken along A-A of FIG. 19. FIG. 21 is a schematic cross-sectional view taken along B-B of FIG. 19. FIG. 22 is a schematic cross-sectional view taken along C-C of FIG. 19.

Referring to FIGS. 19 to 23, a semiconductor device according to some example embodiments includes a first substrate 100, an active pattern AP, a field insulating film 105, a gate structure GS, a gate spacer 140, a gate capping pattern 150, a source/drain region 160, an interlayer insulating film 170, a frontside wiring structure FS, a through contact via 180, a buried wiring 190, and a backside wiring structure BS. The source/drain region 160 may be referred to as a source/drain structure 160.

The first substrate 100 may be a semiconductor substrate. For example, the first substrate 100 may be bulk silicon or silicon-on-insulator (SOI).

The first substrate 100 may include a first side 100a and a second side 100b that are opposite to each other. An active pattern AP may be placed on the first side 100a of the first substrate 100. In this specification, the first side 100a of the first substrate 100 on which the active pattern AP is placed may also be called a front side. Also, the second side 100*b* of the first substrate 100 opposite to the first side 100*a* may also be called a back side.

The active pattern AP may be formed on the first side 100*a* of the first substrate 100. The active pattern AP may extend long in a second direction DR2 parallel to the first side 100*a*. Also, the plurality of active patterns AP may extend side by side in the second direction DR2.

In some example embodiments, the active pattern AP may include first to third bridge patterns 111 to 113 which are sequentially stacked on the first substrate 100, spaced apart from each other and each extend in the second direction DR2. This active pattern AP may be used as a channel region of an MBCFET® (registered trademark) including a multi-bridge channel. The number of bridge patterns included in the active pattern AP is an example only, and is not limited to that shown.

In some example embodiments, the active pattern AP may further include a fin pattern 110. The fin pattern 110 may protrude from the first side 100*a* of the first substrate 100 and extend in the second direction DR2. The first to third bridge patterns 111 to 113 may be sequentially stacked on the upper face of the fin pattern 110.

The field insulating film 105 may be formed on the first side 100*a* of the first substrate 100. The field insulating film 105 may surround at least a part of the side faces of the active pattern AP. In some example embodiments, the field insulating film 105 may include a concave upper face. For example, a height of the upper face of the field insulating film 105 on the basis of the first side 100*a* of the first substrate 100 may decrease and then remain constant, as it goes away from the fin pattern 110. Although the upper part of the fin pattern 110 is only shown to protrude from the upper face of the field insulating film 105, this is an example only. As another example, the upper face of the fin pattern 110 may be coplanar with the upper face of the field insulating film 105.

The field insulating film 105 may include, for example, but is not limited to, at least one of silicon oxide ($SiO_2$), silicon oxynitride (SiON), silicon oxycarbonitride (SiOCN) or combinations thereof.

A gate structure GS may be formed on the active pattern AP and the field insulating film 105. The gate structure GS may intersect the active pattern AP. For example, the gate structure GS may extend long in the first direction DR1 parallel to the first side 100*a* and intersecting the second direction DR2.

In some example embodiments, at least a part of the active pattern AP may extend in the second direction DR2 and penetrate through the gate structure GS. For example, the first to third bridge patterns 111 to 113 may each extend in the second direction DR2 and penetrate through the gate structure GS. The gate structure GS may surround periphery of each of the first to third bridge patterns 111 to 113.

The gate structure GS may include a gate dielectric film 120 and a gate electrode 130. The gate dielectric film 120 and the gate electrode 130 may be sequentially stacked on the active pattern AP.

The gate dielectric film 120 may be stacked on the active pattern AP. For example, the gate dielectric film 120 may extend along the upper face and side faces of the active pattern AP and the upper face of the field insulating film 105. Also, the gate dielectric film 120 may surround the periphery of at least a part of the active pattern AP. For example, the gate dielectric film 120 may extend along the periphery of each of the first to third bridge patterns 111 to 113.

The gate dielectric film 120 may include, for example, at least one of silicon oxide, silicon oxynitride, silicon nitride or a high dielectric constant material having a higher dielectric constant than silicon oxide.

A semiconductor device according to some example embodiments may include a NC (Negative Capacitance) FET using a negative capacitor. For example, the gate dielectric film 120 may include a ferroelectric material film having ferroelectric properties, and a paraelectric material film having paraelectric properties.

A gate electrode 130 may be stacked on the gate dielectric film 120. That is, the gate dielectric film 120 may be interposed between the active pattern AP and the gate electrode 130. The gate dielectric film 120 may be interposed between the field insulating film 105 and the gate electrode 130.

Although the gate electrode 130 is only shown as a single film, this is merely an example, and it goes without saying that the gate electrode 130 may be formed by stacking a plurality of conductive layers. For example, the gate electrode 130 may include a work function adjusting film that adjusts the work function, and a filling conductive film that fills a space formed by the work function adjusting film. The work function adjusting film may include, for example, at least one of TiN, TaN, TiC, TaC, TiAlC, and combinations thereof. The filling conductive film may include, for example, W or Al.

A gate spacer 140 may be formed on the first substrate 100 and the field insulating film 105. Also, the gate spacer 140 may extend along the side faces of the gate electrode 130. In some example embodiments, a part of the gate dielectric film 120 may be interposed between the gate electrode 130 and the gate spacer 140. For example, the gate dielectric film 120 may further extend along the inner face of the gate spacer 140.

The gate spacer 140 may include an insulating material, for example, but is not limited to, at least one of silicon nitride, silicon oxynitride, silicon oxycarbide, silicon boron nitride, silicon boron carbonitride, silicon oxycarbonitride, and combinations thereof.

The gate capping pattern 150 may be formed on the gate structure GS. The gate capping pattern 150 may extend along the upper face of the gate structure GS. Although the upper face of the gate capping pattern 150 is only shown as being coplanar with the upper face of the gate spacer 140, this is an example only. As another example, the gate capping pattern 150 may cover the upper face of the gate spacer 140.

The gate capping pattern 150 may include an insulating material, for example, but is not limited to, at least one of silicon nitride, silicon oxynitride, silicon oxycarbide, silicon boron nitride, silicon boron carbonitride, silicon oxycarbonitride, and combinations thereof.

The source/drain region 160 may be formed on at least one side face (e.g., both side faces) of the gate structure GS. Additionally, the source/drain regions 160 may be connected to the active pattern AP. For example, the upper face of the fin pattern 110 may be connected to the source/drain region 160. Also, the first to third bridge patterns 111 to 113 may each penetrate the gate structure GS and the gate spacer 140, and be connected to the source/drain region 160. The source/drain region 160 may be electrically isolated from the gate electrode 130 by the gate dielectric film 120 and/or the gate spacers 140. Such a source/drain region 160 may be provided as a source or a drain of a field effect transistor including the active pattern AP and the gate structure GS.

In some example embodiments, the source/drain region 160 may include an epitaxial layer. For example, the source/drain region 160 may be an epitaxial pattern formed by an epitaxial growth process.

The interlayer insulating film 170 may be formed to fill the space on the outer face of the gate spacer 140. For example, the interlayer insulating film 170 may cover the field insulating film 105 and the source/drain region 160. The interlayer insulating film 170 may cover the upper face of the gate spacer 140 and the upper face of the gate capping pattern 150.

The interlayer insulating film 170 may each include, for example, at least one of silicon oxide, silicon nitride, silicon oxynitride, silicon oxycarbide, silicon boron nitride, silicon boron carbonitride, silicon oxycarbonitride, and a low dielectric constant material having a dielectric constant smaller than silicon oxide.

The frontside wiring structure FS may be placed on the first side 100a of the first substrate 100. For example, the frontside wiring structure FS may be formed on the upper face of the interlayer insulating film 170. The frontside wiring structure FS may include a front inter-wiring insulating film 310, a plurality of frontside wiring patterns FM1 to FM4, and a plurality of frontside via patterns FV1 to FV4. The frontside wiring patterns FM1 to FM4 may be sequentially stacked on the interlayer insulating film 170. The frontside via patterns FV1 to FV4 may be sequentially stacked on the interlayer insulating film 170. The frontside via patterns FV1 to FV4 may connect the frontside wiring patterns FM1 to FM4 to each other. The frontside wiring patterns FM1 to FM4 and the frontside via patterns FV1 to FV4 may be formed inside the front inter-wiring insulating film 310. The frontside wiring patterns FM1 to FM4 and the frontside via patterns FV1 to FV4 may be insulated from each other by the front inter-wiring insulating film 310, respectively. The number of layers, the number, the placement and the like of the front inter-wiring insulating film 310, the frontside wiring patterns FM1 to FM4, and the frontside via patterns FV1 to FV4 are merely examples, and are not limited to those shown in the drawings.

In some example embodiments, the width of each of the frontside via patterns FV1 to FV4 may decrease toward the first side 100a of the first substrate 100.

The frontside wiring structure FS may provide a signal line and/or a power line for various electronic elements (e.g., the field effect transistor including the active pattern AP and the gate structure GS) formed on the first side 100a of the first substrate 100. For example, the source/drain contact CA may be formed on the source/drain region 160. The source/drain contact CA may penetrate through the interlayer insulating film 170 and be connected to the source/drain region 160. A first frontside via pattern FV1 of the frontside wiring structure FS may be connected to the source/drain contact CA. The frontside wiring structure FS may be electrically connected to the source/drain region 160, accordingly. The silicide film 165 may be placed between the source/drain region 160 and the source/drain contact CA.

The frontside wiring patterns FM1 to FM4 and the frontside via patterns FV1 to FV4 may each include a barrier conductive film and a filling conductive film.

In some example embodiments, the width of each source/drain contact CA may decrease toward the first side 100a of the first substrate 100.

The backside wiring structure BS may be placed on the second side 100b of the first substrate 100. The backside wiring structure BS may include a backside inter-wiring insulating film 320, a plurality of backside wiring patterns BM1 to BM3, and a plurality of backside via patterns BV1 to BV3. The backside wiring patterns BM1 to BM3 may be sequentially stacked on the second side 100b of the first substrate 100. The backside via patterns BV1 to BV3 may be sequentially stacked on the second side 100b of the first substrate 100. The backside via patterns BV1 to BV3 may connect the backside wiring patterns BM1 to BM3 to each other. The backside wiring patterns BM1 to BM3 and the backside via patterns BV1 to BV3 may be formed inside the backside inter-wiring insulating film 320. The backside wiring patterns BM1 to BM3 and the backside via patterns BV1 to BV3 may be insulated from each other by the backside inter-wiring insulating film 320. The number of layers, number, placement and the like of the backside inter-wiring insulating film 320, the backside wiring patterns BM1 to BM3, and the backside via patterns BV1 to BV3 are merely examples, and are not limited to that shown.

In some example embodiments, the width of each of the backside via patterns BV1 to BV3 may decrease toward the second side 100b of the first substrate 100.

In some example embodiments, the backside wiring structure BS may provide a power delivery network (PDN) for various electronic elements (e.g., a field effect transistor including the active pattern AP and gate structure GS) formed on the first side 100a of the first substrate 100. For example, the backside wiring structure BS may be electrically connected to the buried pattern PR. A power supply voltage (for example, a source voltage $V_{SS}$ or a drain voltage $V_{DD}$) supplied from the outside may be transferred to the uppermost wiring (for example, a third backside wiring pattern BM3) of the backside wiring structure BS, and may be provided to the source/drain region 160 through the buried pattern PR, the through contact via 180 and the source/drain contact CA.

In some example embodiments, the buried pattern PR may extend in the second direction DR2 from a planar point of view. Such a buried pattern PR may be provided as a power rail for various electronic elements (e.g., the field effect transistor including the active pattern AP and the gate structure GS) formed on the first side 100a of the first substrate 100.

Although it is not specifically shown, the backside wiring patterns BM1 to BM3 and the backside via patterns BV1 to BV3 may each include a barrier conductive film and a filling conductive film.

The through contact via 180 may extend in the third direction DR3 and penetrate the interlayer insulating film 170 and the field insulating film 105. The through contact via 180 may be electrically connected to various electronic elements (e.g., the field effect transistors including the active patterns AP and the gate structures GS) formed on the first side 100a of the first substrate 100.

In some example embodiments, the through contact via 180 may be electrically connected to the source/drain contact CA. For example, the through contact via 180 may be in contact with the source/drain contact CA. The through contact via 180 may be in contact with, for example, the upper face of the source/drain contact CA in the third direction DR3.

In some example embodiments, the width of the through contact via 180 may gradually decrease in the third direction DR3 from the frontside wiring structure FS to the backside wiring structure BS.

The buried wiring 190 may be formed inside the first substrate 100. The buried wiring 190 may be connected to the through contact via 180. For example, the upper face of the buried wiring 190 may be connected to the lower part of the through contact via 180 penetrating the first side 100a of the first substrate 100. Accordingly, the buried wiring 190 may be electrically connected to various electronic elements (e.g., the field effect transistor including the active pattern AP and the gate structure GS) formed on the first side 100a of the first substrate 100. As an example, the buried wiring 190 may be electrically connected to the source/drain region 160.

In some example embodiments, the width of the buried wiring 190 may gradually increase in the third direction DR3 from the first side 100a of the first substrate 100 to the second side 100b of the first substrate 100.

Referring to FIG. 20, the through contact via 180 may include an insulating liner 182, a first barrier conductive film 184 and a first plug conductive film 186. The first plug conductive film 186 may include a seam 186s inside. The through contact via 180, the buried wiring 190, and the first substrate 100 may correspond to any one via, wiring, and second film among the via 30, the wiring 40, and the second film 20 described using FIGS. 1 to 4. The insulating liner 182, the first barrier conductive film 184 and the first plug conductive film 186 may correspond to any one insulating liner, first barrier conductive film and first plug conductive film among the insulating liner 32, the first barrier conductive film 34 and the first plug conductive film 36 described using FIGS. 1 to 4. Although the via 30 and the wiring 40 of FIG. 1 are shown as the through contact via 180 and the buried wiring 190 in FIG. 20, the embodiment is not limited thereto.

Referring to FIG. 23, the through contact via 180 may include an insulating liner 182 and a first plug conductive film 186. The through contact via 180, the buried wiring 190, and the first substrate 100 may correspond to any one via, wiring and second film among the via 30, the wiring 40, and the second film 20 described using FIGS. 5 to 11. The insulating liner 182 and the first plug conductive film 186 may correspond to any one of insulating liner and first plug conductive film among the insulating liner 32 and the first plug conductive film 36 described using FIGS. 1 to 4. Although the via 30 and the wiring 40 of FIG. 5 are shown as the through contact via 180 and the buried wiring 190 in FIG. 23, the embodiment is not limited thereto. The plug conductive film 186 may include a first portion 1861, and a second portion 1862 placed below the first portion 1861.

Figure 24:
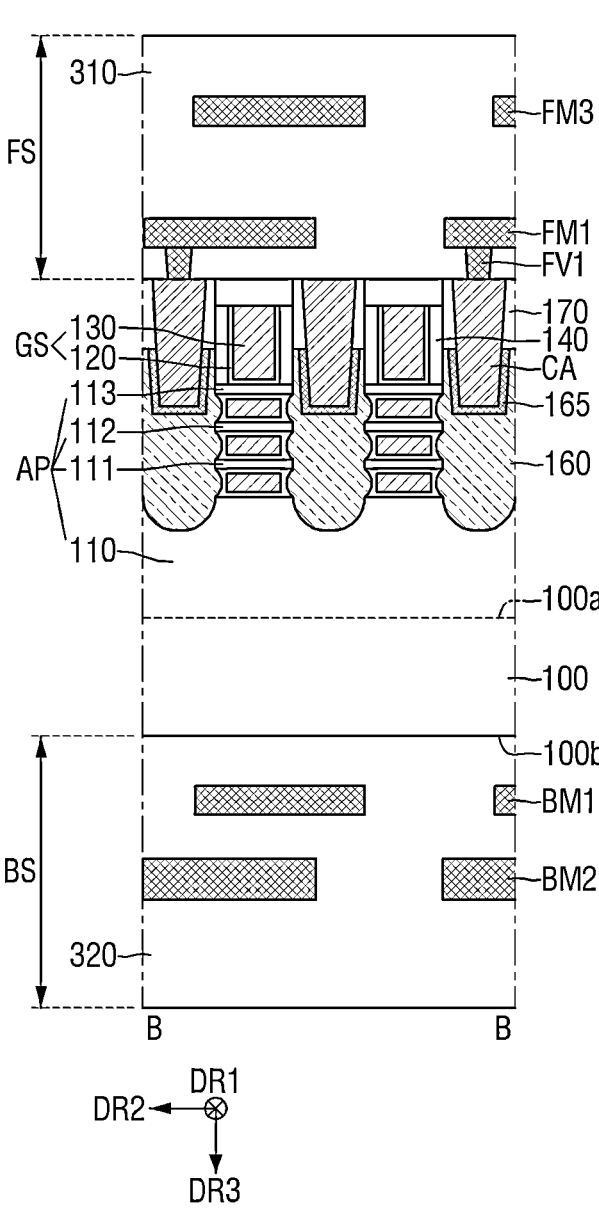
FIGS. 24 and 25 are diagrams for explaining a semiconductor device according to some example embodiments.
Figure 25:
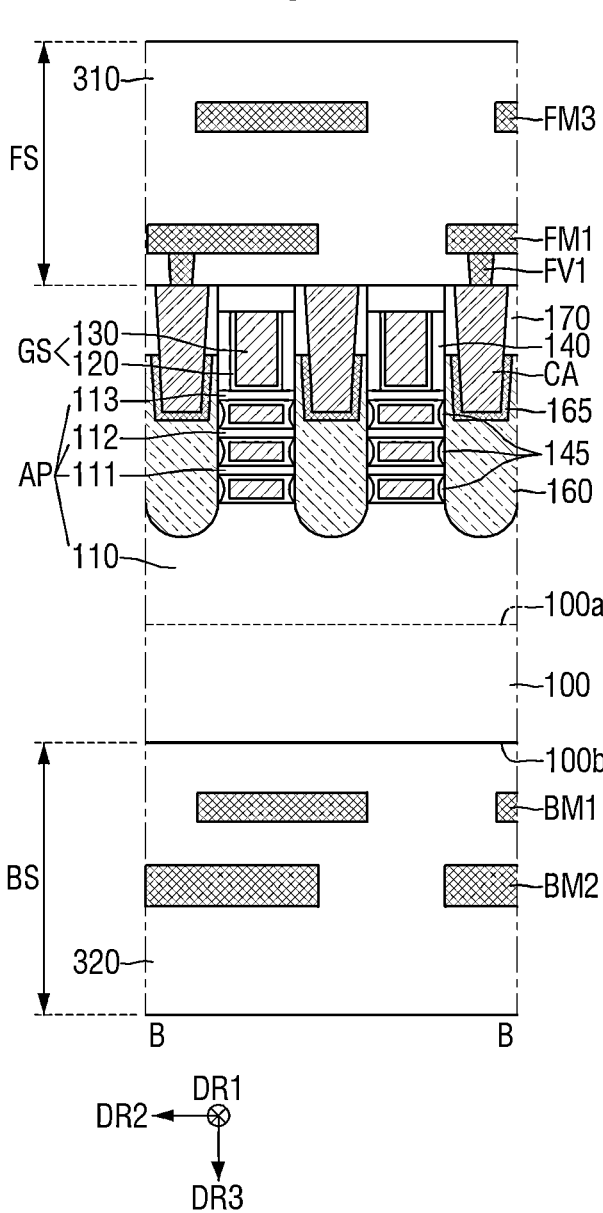

FIGS. 24 and 25 are diagrams for explaining a semiconductor device according to some example embodiments. FIGS. 24 and 25 are schematic cross-sectional views taken along B-B of FIG. 19.

Referring to FIG. 24, in the semiconductor device according to some example embodiments, inner spacers 145 may be further placed on the side faces of the gate electrode 130. The inner spacers 145 may be formed on side faces of the gate electrode 130 between the first to third bridge patterns 111 to 113. Also, the inner spacers 145 may be formed on side faces of the gate electrode 130 between the fin pattern 110 and the first bridge pattern 111. The gate electrode 130 may be electrically isolated from the source/drain region 160 by the gate dielectric film 120, the gate spacer 140 and/or the inner spacers 145.

The inner spacers 145 may include the same material as the gate spacers 140 or may include different material from the gate spacers 140.

Referring to FIG. 25, in the semiconductor device according to some example embodiments, the outer walls of the source/drain region 160 may have a wavy shape.

Figure 26:
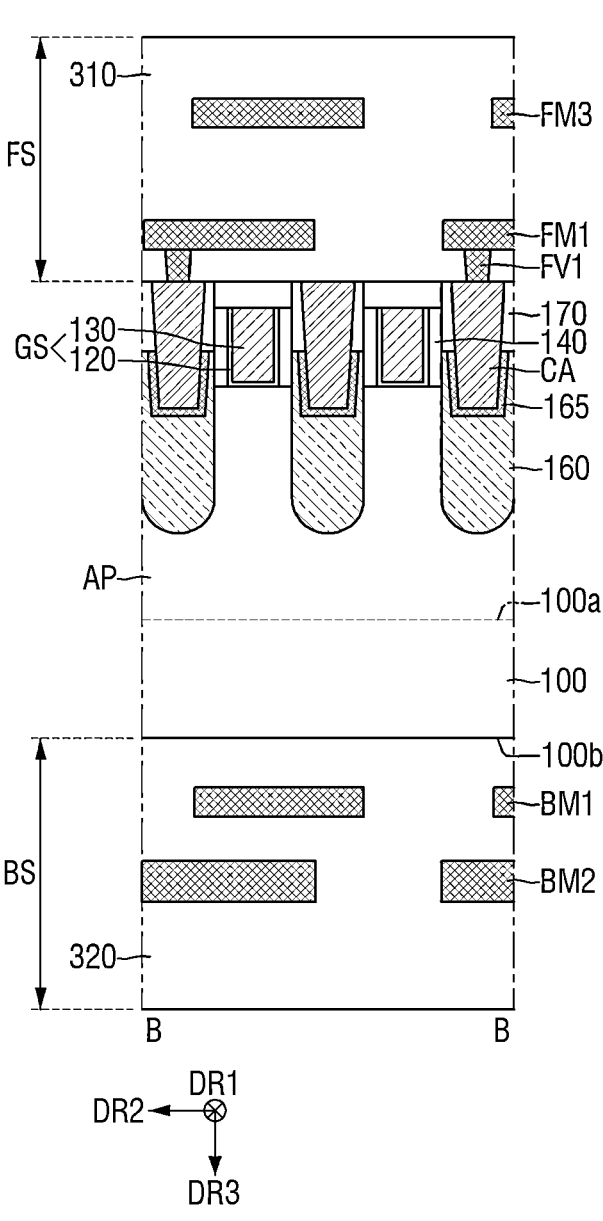
FIGS. 26 and 27 are diagrams for explaining a semiconductor device according to some example embodiments.
Figure 27:
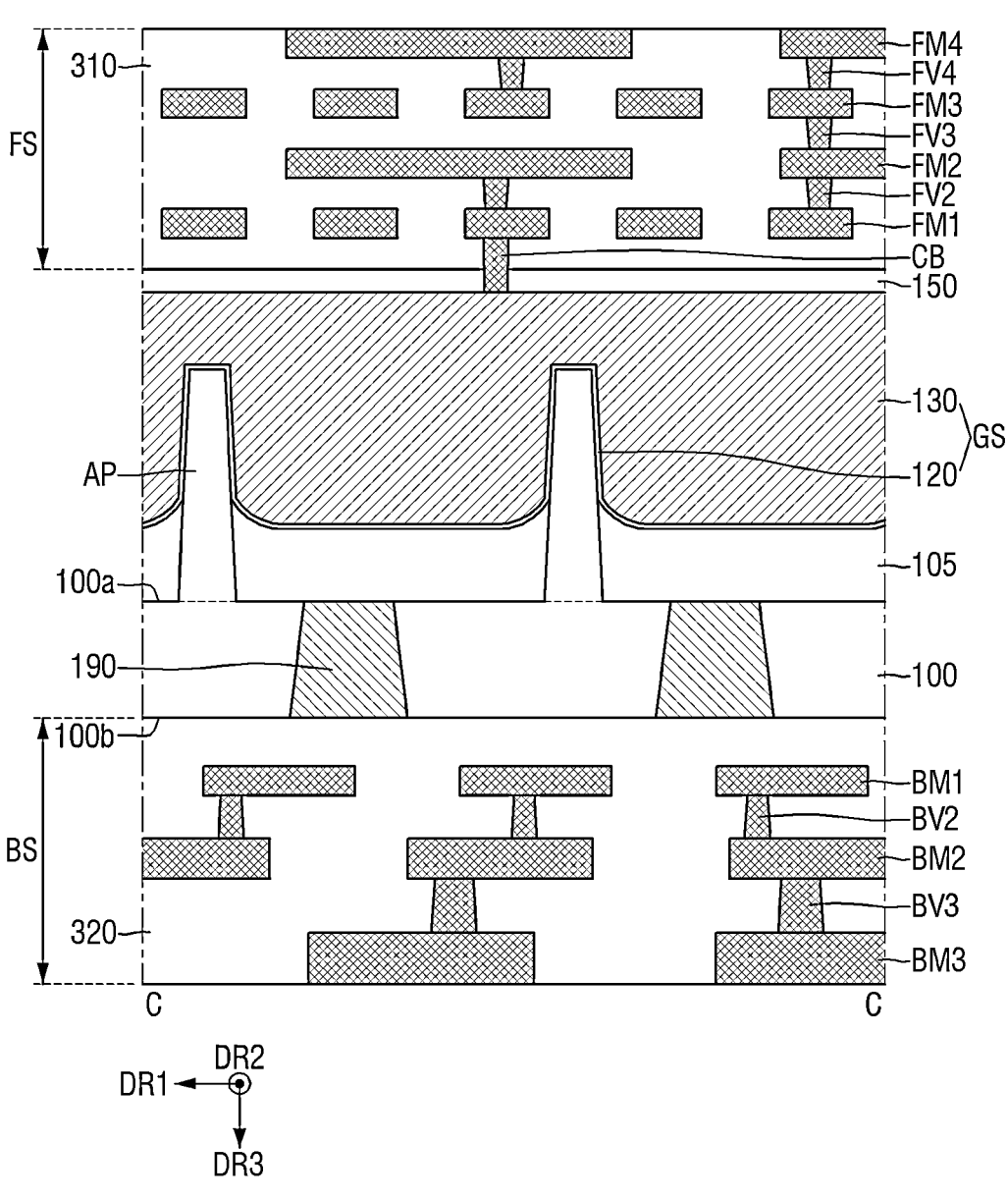

FIGS. 26 and 27 are diagrams for explaining the semiconductor device according to some example embodiments.

FIG. 26 is a schematic cross-sectional view taken along B-B of FIG. 19. FIG. 27 is a schematic cross-sectional view taken along C-C of FIG. 19. For convenience of explanation, points different from those explained using FIGS. 1 to 23 will be mainly explained.

Referring to FIGS. 26 and 27, in the semiconductor device according to some example embodiments, the active pattern AP does not include a bridge pattern. The active pattern AP may be a fin-shaped pattern protruding upward from the upper face of the field insulating film 105.

Figure 28:
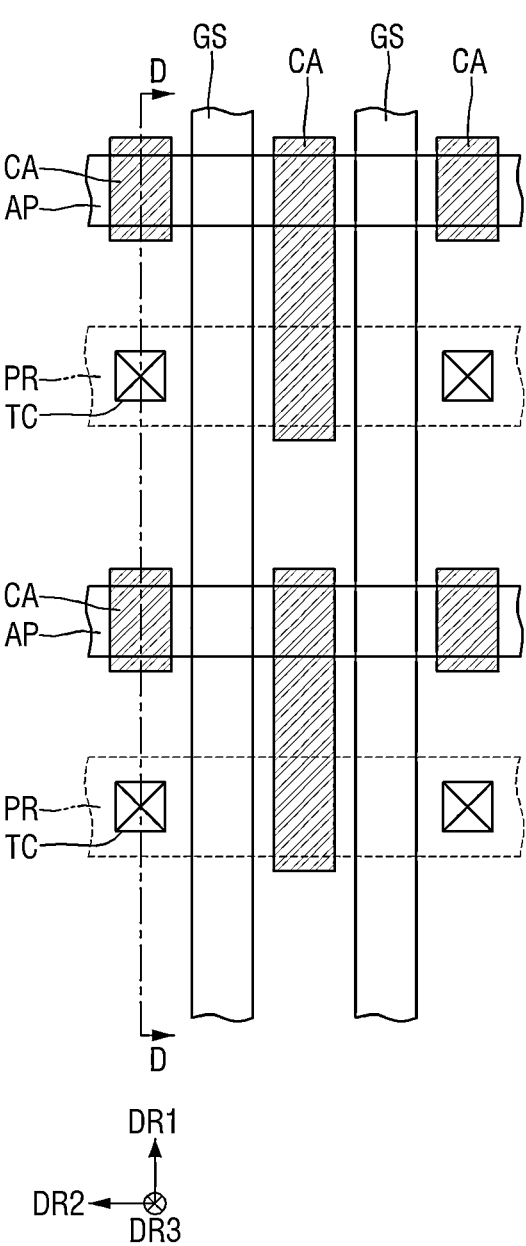
FIG. 28 is a layout diagram for explaining a semiconductor device according to some example embodiments.
Figure 29:
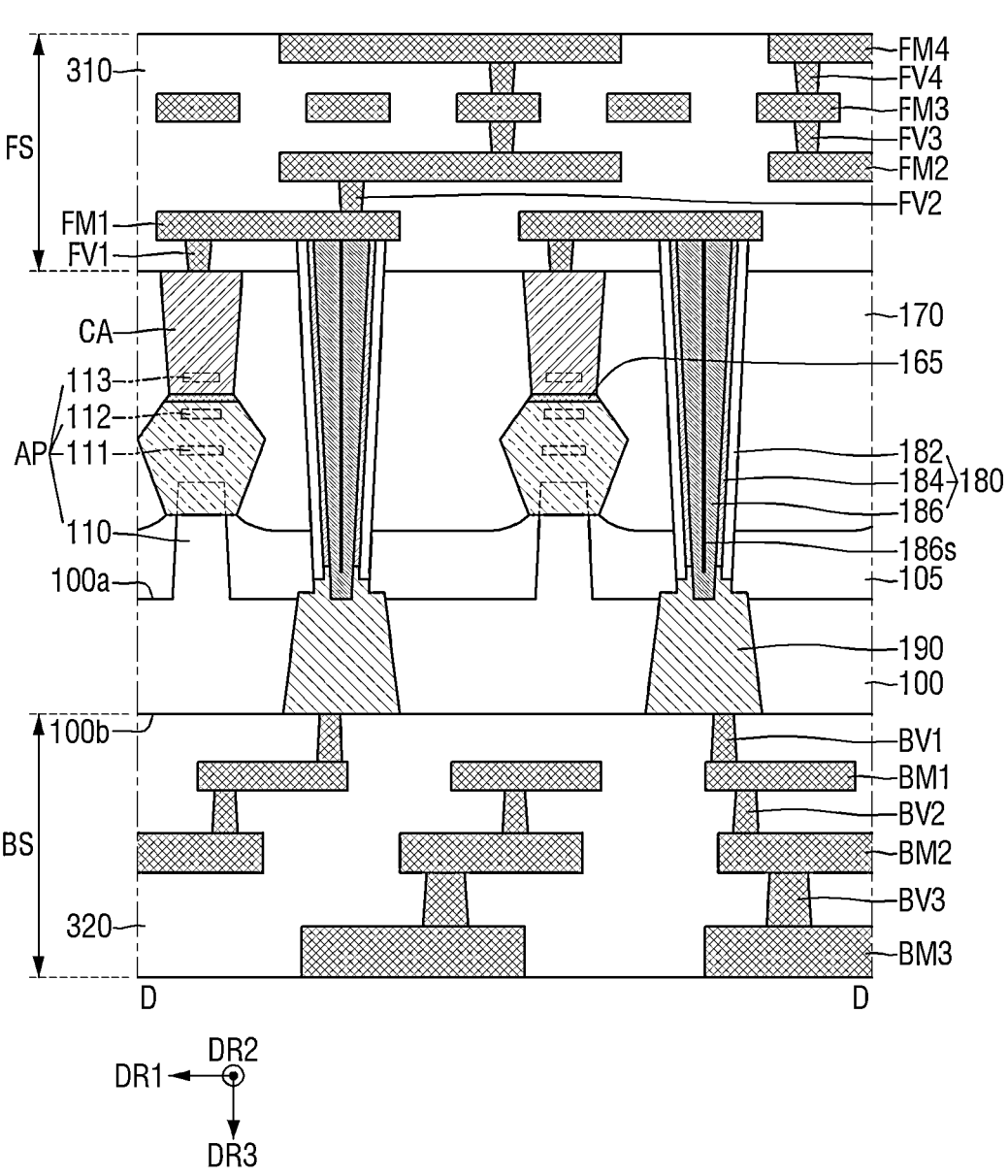
FIGS. 29 and 30 are schematic cross-sectional views taken along line D-D of FIG. 28.
Figure 30:
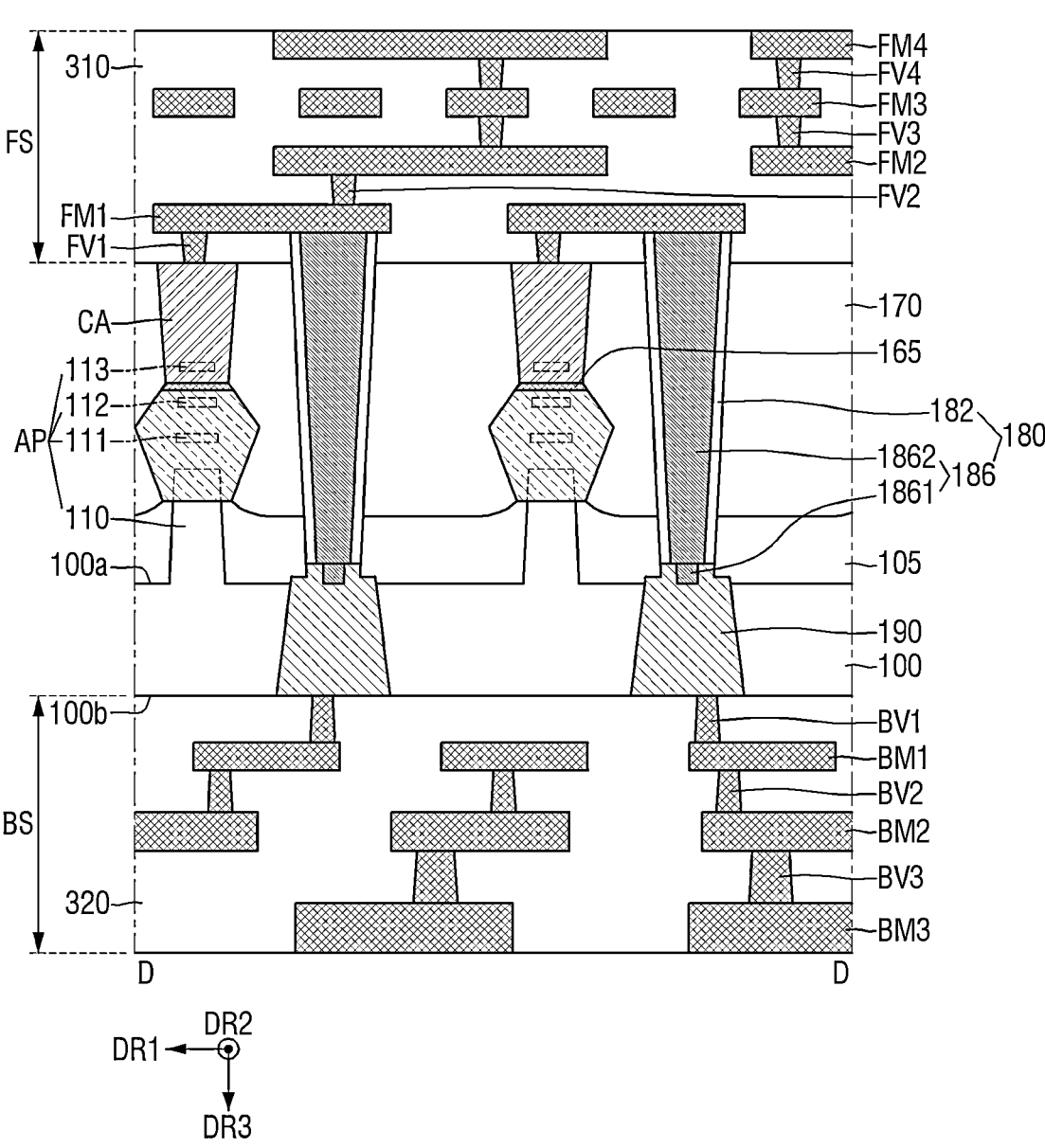

FIG. 28 is a layout diagram for explaining a semiconductor device according to some example embodiments. FIGS. 29 and 30 are schematic cross-sectional views taken along line D-D of FIG. 28.

Referring to FIGS. 28 to 30, in the semiconductor device according to some example embodiments, the through contact via 180 may be electrically connected to the frontside wiring structure FS. For example, the through contact via 180 may be in contact with the frontside wiring pattern FM1.

Referring to FIG. 29, the through contact via 180 may include an insulating liner 182, a first barrier conductive film 184, and a first plug conductive film 186. The first plug conductive film 186 may include a seam 186s inside. The through contact via 180, the buried wiring 190, and the first substrate 100 may correspond to any one via, wiring and second film among the via 30, the wiring 40, and the second film 20 described using FIGS. 1 to 4. The insulating liner 182, the first barrier conductive film 184 and the first plug conductive film 186 may correspond to any one insulating liner, first barrier conductive film and first plug conductive film among the insulating liner 32, the first barrier conductive film 34 and the first plug conductive film 36 described using FIGS. 1 to 4. Although the via 30 and the wiring 40 of FIG. 1 are shown as the through contact via 180 and the buried wiring 190 in FIG. 29, the embodiment is not limited thereto.

Referring to FIG. 30, the through contact via 180 may include an insulating liner 182 and a first plug conductive film 186. The through contact via 180, the buried wiring 190, and the first substrate 100 may correspond to any one via, wiring and second film among the via 30, the wiring 40, and the second film 20 described using FIGS. 5 to 11. The insulating liner 182 and the first plug conductive film 186 may correspond to any one insulating liner and first plug conductive film among the insulating liner 32 and the first plug conductive film 36 described using FIGS. 1 to 4. Although the via 30 and the wiring 40 of FIG. 5 are shown as the through contact via 180 and the buried wiring 190 in FIG. 30, the embodiment is not limited thereto.

Although the embodiments of the present disclosure have been described above with reference to the accompanying drawings, the present disclosure is not limited to the above embodiments, and may be fabricated in various forms. Those skilled in the art will appreciate that the present disclosure may be embodied in other specific forms without changing the technical spirit or essential features of the present disclosure. Accordingly, the above-described embodiments should be understood in all respects as illustrative and not restrictive.

What is claimed is:
1. A semiconductor device comprising:
a first film including a first side and a second side opposite to each other;
a second film including a third side and a fourth side opposite each other, the third side of the second film being in contact with the second side of the first film, the second film and the first film defining parts of a
trench, the trench including a first sub-trench and a second
sub-trench below the first sub-trench, the first sub-trench having a first width and extending
from the fourth side of the second film toward the
first film, the second sub-trench below the first sub-trench having
a second width, the second width being smaller than
the first width;

a plug conductive film extending from the first side of the
first film to penetrate a bottom face of the trench, an
uppermost face of the plug conductive film being inside
the trench;

a via including an insulating liner between the plug
conductive film and the first film; and a wiring in the trench, wherein the uppermost face of the plug conductive film and at least
a part of a side wall of the plug conductive film in the
trench are in contact with the wiring, and an upper face of the insulating liner is exposed by a
bottom face of the second sub-trench.

2. The semiconductor device of claim 1, wherein the trench further comprises a third sub-trench, the third sub-trench is below the second sub-trench and
has a third width, the third width is smaller than the second width, the plug conductive film penetrates a bottom face of the
third sub-trench, the via further comprises a barrier conductive film
between the plug conductive film and the insulating
liner, and an upper face of the barrier conductive film is exposed by
the bottom face of the third sub-trench.

3. The semiconductor device of claim 2, wherein the upper face of the barrier conductive film is in contact
with the wiring.

4. The semiconductor device of claim 2, wherein the barrier conductive film is spaced apart from a part of
the wiring to provide a void between the barrier con-
ductive film and the wiring.

5. The semiconductor device of claim 1, wherein the insulating liner is in contact with the plug conductive
film.

6. The semiconductor device of claim 1, wherein the plug conductive film includes a first portion and a
second portion, the second portion of the plug conductive film is below
the first portion of the plug conductive film, a width of the first portion is smaller than a width of the
second portion at a boundary between the first portion
and the second portion, and the boundary between the first portion and the second
portion is placed below the bottom face of the first
sub-trench.

7. The semiconductor device of claim 6, wherein a grain size of the first portion is different from a grain size
of the second portion.

8. The semiconductor device of claim 6, wherein a material of the first portion and a material of the second
portion are different from each other.

9. The semiconductor device of claim 6, wherein a material of the first portion and a material of the second
portion are a same material.

10. The semiconductor device of claim 6, wherein the boundary between the first portion and the second
portion is below the bottom face of the second sub-
trench.

11. The semiconductor device of claim 1, wherein the insulating liner is spaced apart from a part of the
wiring to provide a void between the insulating liner
and the wiring.

12. The semiconductor device of claim 1, wherein a bottom face of the first sub-trench is inside the first film.

13. A semiconductor device comprising:

a first film including a first side and a second side opposite
each other;

a second film including a third side and a fourth side
opposite each other, the third side of the second film
being in contact with the second side of the first film;

a wiring including a first portion and a second portion, the first portion having a first width and extending from
the fourth side of the second film toward the first
film, the second portion below the first portion and having a
second width, and the second width being smaller than the first width; and a plug conductive film extending from the first side of the
first film to penetrate a bottom face of the wiring, an
uppermost face of the plug conductive film and a part
of side walls of the plug conductive film being in
contact with the wiring; and a via including an insulating liner between the plug
conductive film and the first film.

14. The semiconductor device of claim 13, wherein the insulating liner is in contact with the second portion of
the wiring.

15. The semiconductor device of claim 13, wherein the wiring further comprises a third portion below the
second portion, the third portion has a third width, the third width is smaller than the second width, the via further comprises a barrier conductive film
between the plug conductive film and the insulating
liner, and the barrier conductive film is in contact with the third
portion.

16. The semiconductor device of claim 13, wherein a side wall of the plug conductive film has a step.

17. The semiconductor device of claim 13, wherein the insulating liner is in contact with the plug conductive
film.

18. A semiconductor device comprising:

a substrate including a first side and a second side
opposite each other;

an active pattern on the first side of the substrate;

a source/drain region in contact with the active pattern;

a frontside wiring structure on the first side of the sub-
strate, the frontside wiring structure extending in a first
direction and being electrically connected to the source/
drain region;

a through contact via electrically connected to the source/
drain region, the through contact via because spaced
apart from a side of the source/drain region;

a buried wiring in the substrate and electrically connected
to the through contact via; and a backside wiring structure electrically connected to the
buried wiring, the backside wiring structure on the
second side of the substrate, wherein the buried wiring includes a first portion and a second
portion below the first portion, the first portion extends from the second side of the substrate toward the first side, the first portion has a first width, and the second portion has a second width, and the second width is smaller than the first width, the through contact via includes a plug conductive film and an insulating liner, the plug conductive film penetrates through an upper face of the second portion, a lowermost face of the plug conductive film and a part of a side wall of the plug conductive film are in contact with the buried wiring, and the insulating liner extends along the side wall of the plug conductive film.

19. The semiconductor device of claim 18, further comprising:

a source/drain contact, wherein the source/drain contact electrically connects the source/drain region and the frontside wiring structure, and the through contact via is electrically connected to the source/drain contact.

20. The semiconductor device of claim 18, further comprising:

a source/drain contact, wherein the source/drain contact electrically connects the source/drain region and the frontside wiring structure, and the through contact via is electrically connected to the frontside wiring structure.

\* \* \* \* \*